United States Patent
Yamauchi

(10) Patent No.: US 11,282,809 B2
(45) Date of Patent: Mar. 22, 2022

(54) METHOD OF MANUFACTURING ELECTRONIC COMPONENT AND METHOD OF MANUFACTURING SEMICONDUCTOR DEVICE

(71) Applicant: SUMITOMO ELECTRIC DEVICE INNOVATIONS, INC., Yokohama (JP)

(72) Inventor: Yasuyuki Yamauchi, Yokohama (JP)

(73) Assignee: SUMITOMO ELECTRIC DEVICE INNOVATIONS, INC., Yokohama (JP)

( * ) Notice: Subject to any disclaimer, the term of this patent is extended or adjusted under 35 U.S.C. 154(b) by 300 days.

(21) Appl. No.: 16/721,007

(22) Filed: Dec. 19, 2019

(65) Prior Publication Data

US 2020/0203306 A1 Jun. 25, 2020

(30) Foreign Application Priority Data

Dec. 25, 2018 (JP) .............................. JP2018-240762

(51) Int. Cl.
*H01L 23/00* (2006.01)
(52) U.S. Cl.
CPC .............. *H01L 24/75* (2013.01); *H01L 24/11* (2013.01); *H01L 2224/11013* (2013.01)
(58) Field of Classification Search
CPC ........... H01L 24/11; H01L 2224/11013; H01L 21/52; H01L 24/75; H01L 23/053; H01L 21/4814; H01L 23/488; H01L 24/10; H01L 24/15; Y10T 29/4913; Y10T 29/49133; Y10T 29/49144
USPC .......................................... 29/832, 834, 840
See application file for complete search history.

(56) References Cited

U.S. PATENT DOCUMENTS

| | | | |
|---|---|---|---|
| 6,336,581 B1 * | 1/2002 | Tuchiya | B23K 3/0615 228/245 |
| 7,368,666 B2 * | 5/2008 | Takeda | H05K 1/141 29/840 |
| 2017/0129032 A1 * | 5/2017 | Kim | H01L 24/742 |

FOREIGN PATENT DOCUMENTS

| JP | H06-314749 A | 11/1994 |
|---|---|---|
| JP | 2002-261120 A | 9/2002 |

* cited by examiner

*Primary Examiner* — Donghai D Nguyen
(74) *Attorney, Agent, or Firm* — Oliff PLC

(57) ABSTRACT

A method of manufacturing an electronic component having an electrode at an end portion thereof is disclosed. The method includes placing a jig on a heater block, wherein the jig includes a path inclined with respect to a pedestal including a placement surface and extending toward the pedestal; placing an electronic component main body having the electrode on the placement surface with the electrode facing the path; rolling a ball-shaped solder in the path to reach the electrode; and melting the solder through the pedestal to attach the molten solder to the electrode.

6 Claims, 20 Drawing Sheets

*Fig.3*
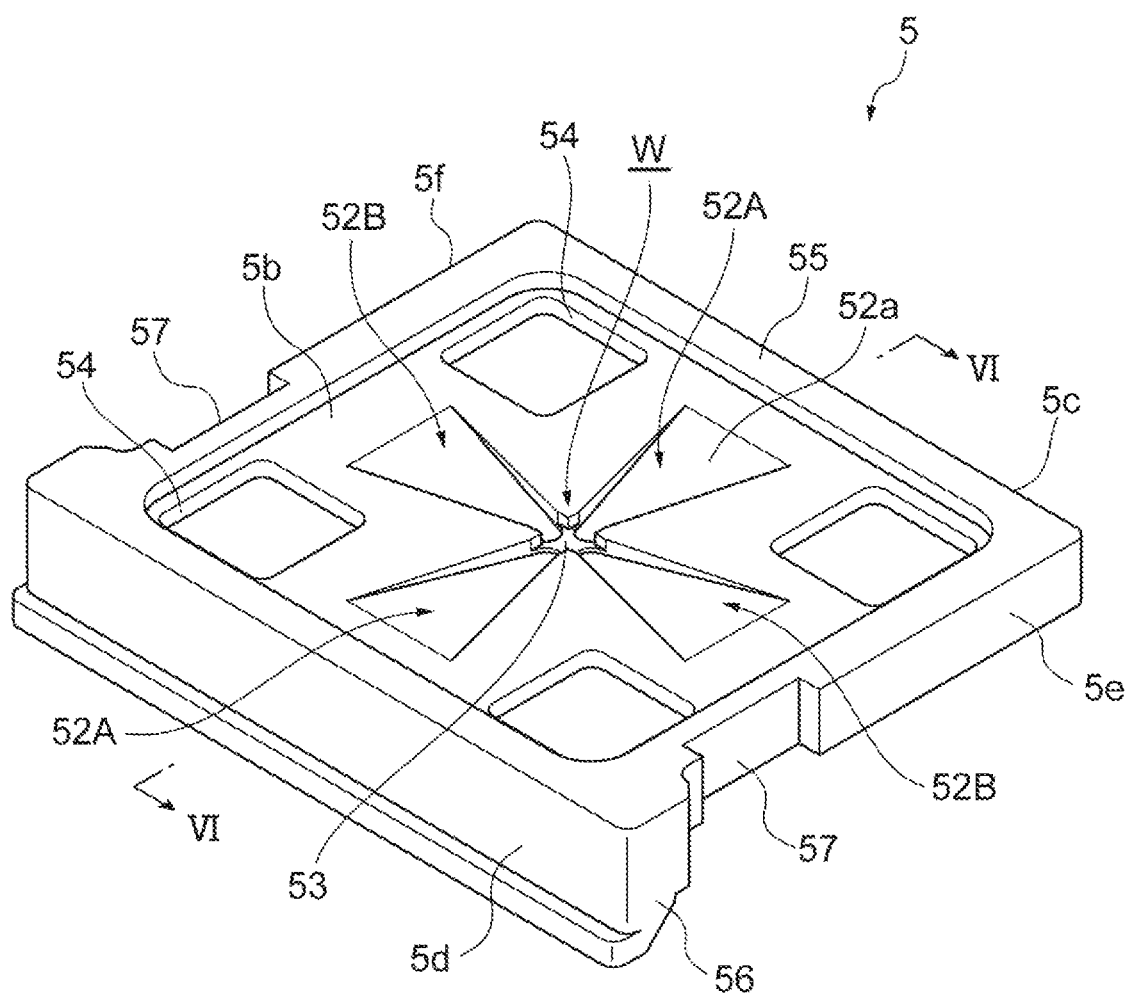
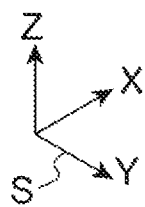

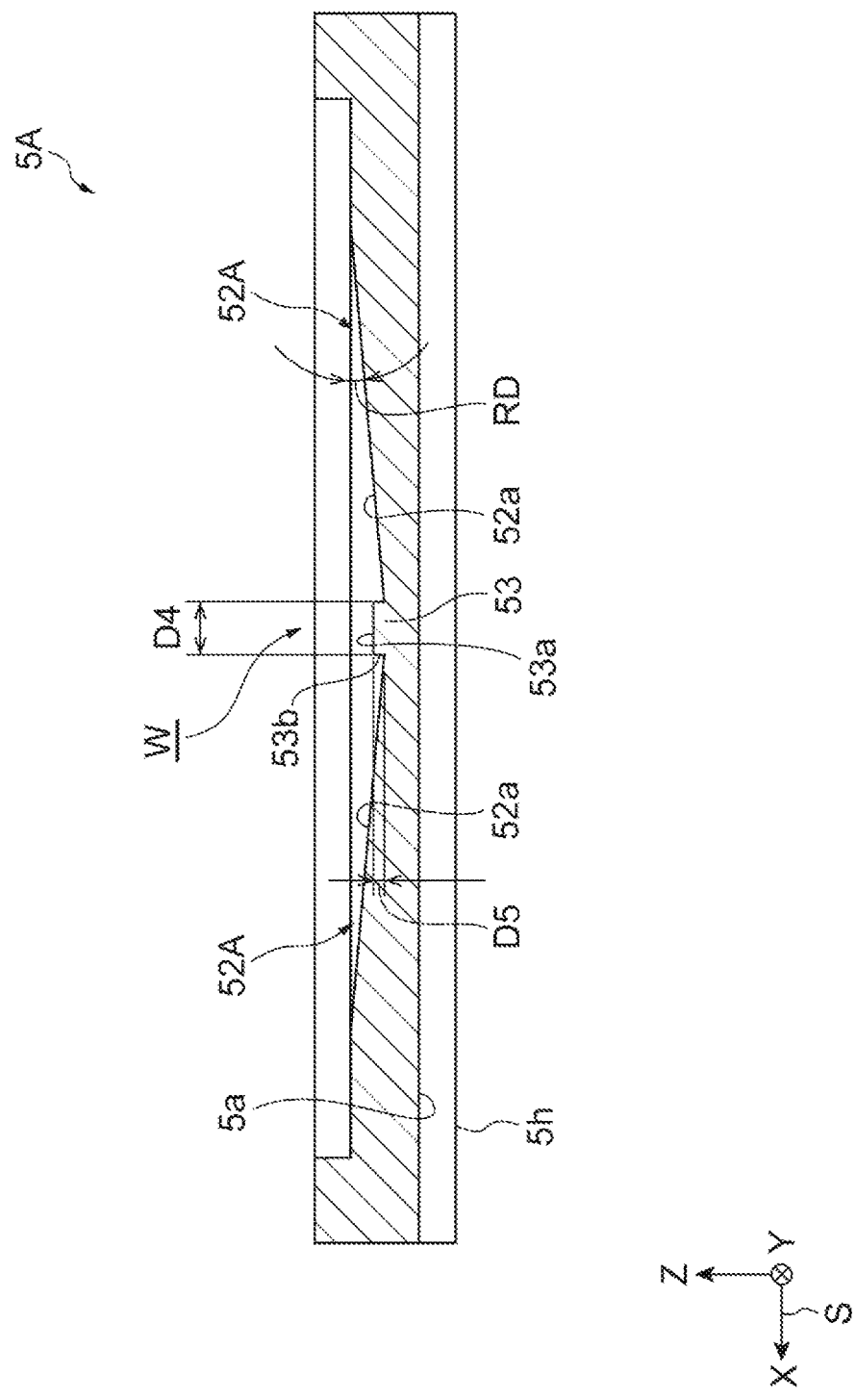

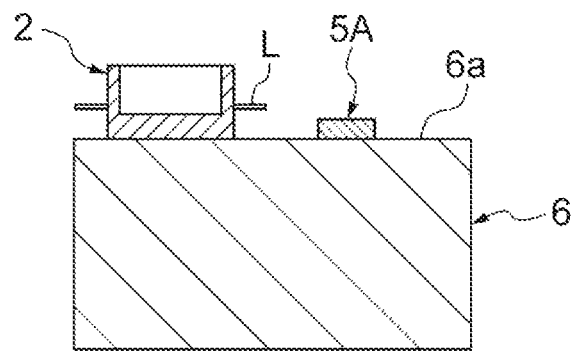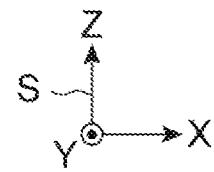
*Fig.18A*
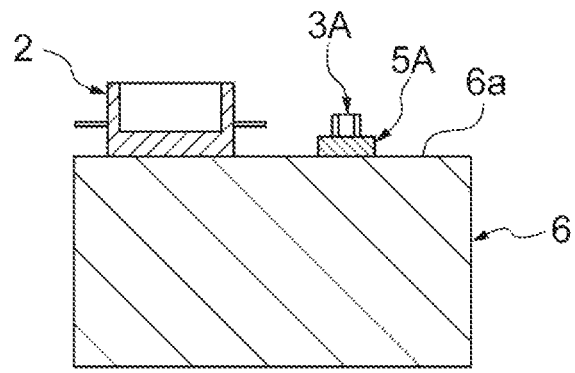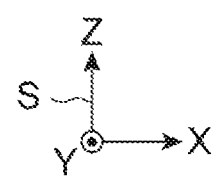
*Fig.18B*
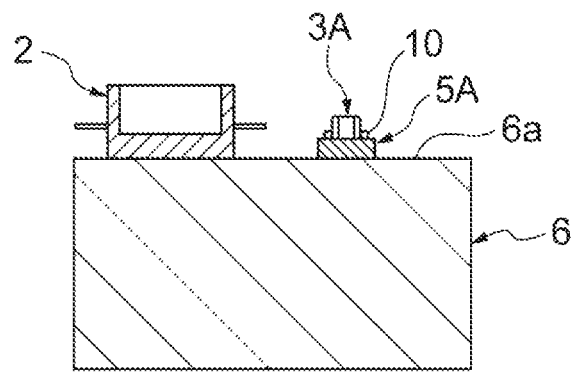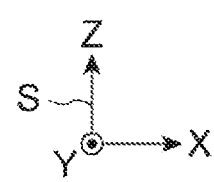
*Fig.18C*
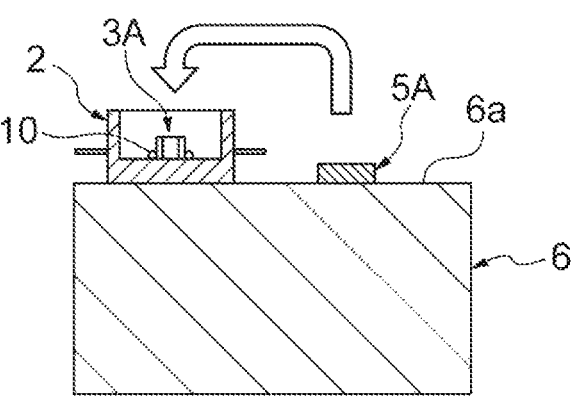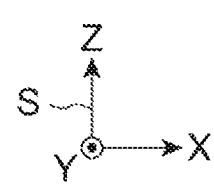
*Fig.18D*

METHOD OF MANUFACTURING ELECTRONIC COMPONENT AND METHOD OF MANUFACTURING SEMICONDUCTOR DEVICE

CROSS-REFERENCE TO RELATED APPLICATION

This application is based upon and claims the benefit of priority from Japanese Patent Application No. 2018-240762, filed on Dec. 25, 2018, the entire contents of which are incorporated herein by reference.

TECHNICAL FIELD

The present disclosure relates to a method of manufacturing an electronic component and a method of manufacturing a semiconductor device.

BACKGROUND

JP 2002-261120A discloses a method of manufacturing a mounting substrate in which solder bumps are formed on electrode portions of the mounting substrate by solder melted by heat treatment, and a semiconductor device including the mounting substrate. In the method of manufacturing a mounting substrate, cream solder is printed on an electrode surface of the substrate using a screen printing method, and then heat treatment is performed to melt the solder and to form the solder bumps.

JP H06-314749A discloses a manufacturing process of a semiconductor device in which a semiconductor chip is soldered to a predetermined region of a mount portion provided in a package. In the manufacturing process of a semiconductor device, the semiconductor chip is manually mounted on a chip mounting portion formed to be uplifted from the mount portion of the package by soldering.

SUMMARY

The present disclosure provides a method for manufacturing an electronic component having an electrode at an end portion thereof. The method comprises: placing a jig on a heater block, wherein the jig includes a path inclined with respect to a pedestal including a placement surface and extending toward the pedestal; placing an electronic component main body having the electrode on the placement surface with the electrode facing the path; rolling a ball-shaped solder in the path to reach the electrode; and melting the solder through the pedestal to attach the molten solder to the electrode.

The present disclosure provides a method of manufacturing an electronic component having an electrode at an end portion thereof. The method comprises: placing a jig on a mounted body, wherein the jig includes a path inclined with respect to a pedestal including a placement surface and extending toward the pedestal; placing the mounted body on which the jig is placed on a heater block; placing an electronic component main body having the electrode on the placement surface with the electrode facing the path; rolling a ball-shaped solder in the path to reach the electrode; and melting the solder through the pedestal to attach the molten solder to the electrode.

BRIEF DESCRIPTION OF THE DRAWINGS

The foregoing and other purposes, aspects and advantages will be better understood from the following detailed description of embodiments of the disclosure with reference to the drawings, in which:

FIG. 3 is a perspective view showing a schematic configuration of a jig according to the embodiment;

FIG. 17 is a cross-sectional view showing a jig according to a modified example;

FIGS. 18A to 18D are schematic diagrams showing respective steps in a method of manufacturing an electronic component according to the modified example;

DETAILED DESCRIPTION

Figure 1:
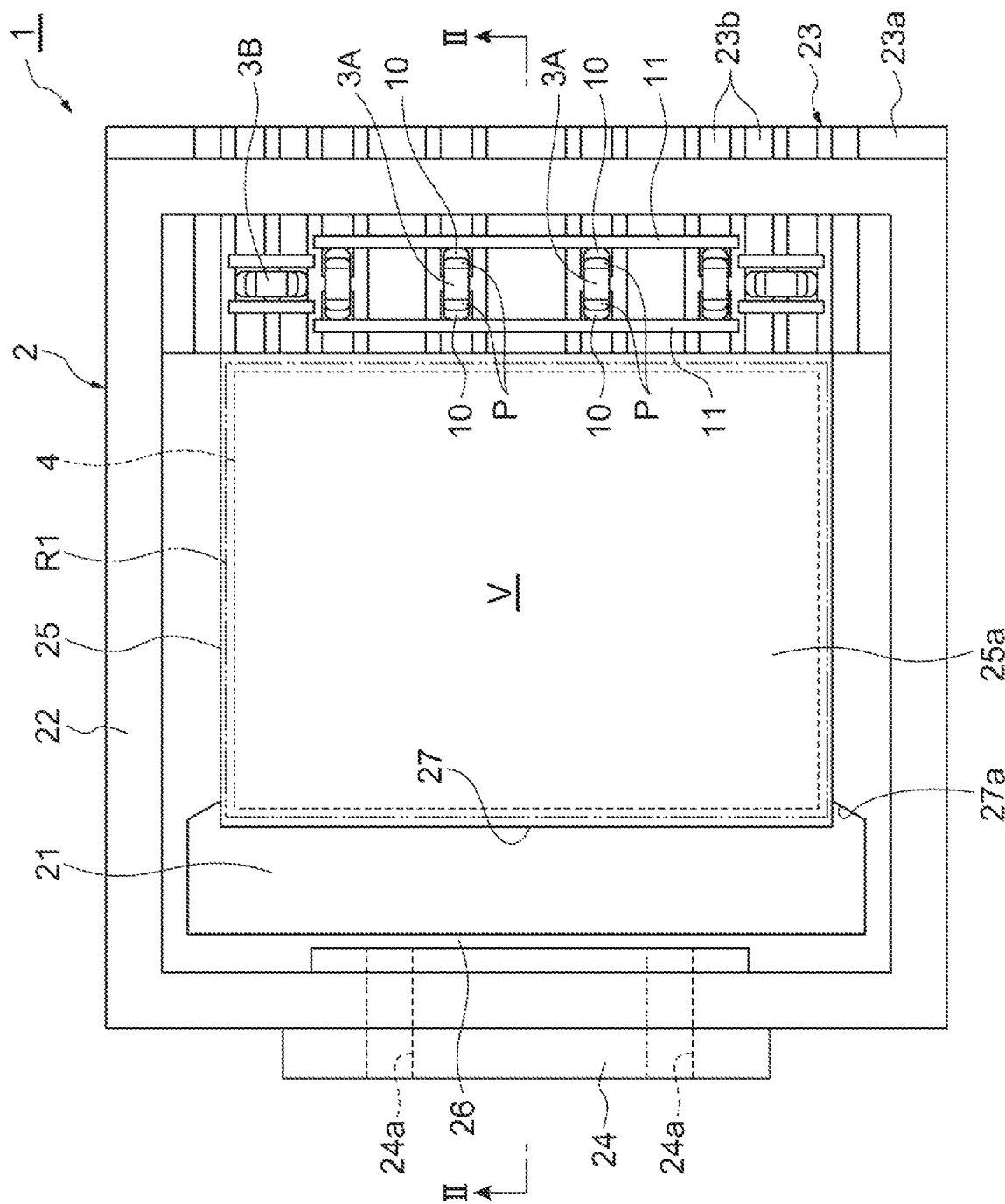
FIG. 1 is a plan view showing a schematic configuration of a modulator as a semiconductor device according to an embodiment.

[Problem to be Solved by the Present Disclosure]

When the semiconductor devices disclosed in JP 2002-261120A and JP H06-314749A are manufactured, molten solder may be attached to an electrode of an electronic component to be mounted, and the electronic component may be mounted on a mounted body such as a package or a substrate by a solder connection of the electrode. In such a case, for example, it is conceivable that the molten solder is manually attached to the electrodes of the electronic component.

On the other hand, when the electronic component is mounted on the mounted body by the solder connection of the electrode, and a position at which the solder is attached is greatly displaced from a position at which the electrode is to be connected to the mounted body, or an amount of attached solder is insufficient, for example, a conduction failure easily occurs between the electronic component and the mounted body due to an insufficient connection area between the electrode and the mounted body. However, in the method of manually attaching the solder to the electrode, it is difficult to attach the solder to the electrode in a desired state.

The present disclosure provides a method of manufacturing an electronic component and a method of manufacturing a semiconductor device which is able to reduce conduction failure between an electronic component and a mounted body when the electronic component is mounted on the mounted body by a solder connection of an electrode.

[Effect of the Present Disclosure]

According to the present disclosure, when an electronic component is mounted on a mounted body by a solder connection of an electrode, it is possible to reduce conduction failure between the electronic component and the mounted body.

Description of Embodiments of Present Disclosure

The contents of embodiments of the present disclosure will be listed and described. A manufacturing method according to one embodiment is a method of manufacturing an electronic component having an electrode at an end portion thereof. The method comprises: placing a jig on a heater block, wherein the jig includes a path inclined with respect to a pedestal including a placement surface and extending toward the pedestal; placing an electronic component main body having the electrode on the placement surface with the electrode facing the path; rolling a ball-shaped solder in the path to reach the electrode; and melting the solder through the pedestal to attach the molten solder to the electrode.

In the method of manufacturing an electronic component, the path inclined toward the pedestal is formed in the jig prepared in the placing step of the jig. In the rolling step, the ball-shaped solder moves toward the electrode by rolling in the path. Thus, the solder can be positioned at a position at which it reaches the electrode. Additionally, in the melting step, the solder can be heated and melted at the position at which it reaches the electrode. In this way, the solder can always be attached to the electrode in the same molten state.

A method of manufacturing according to another embodiment is a method of manufacturing an electronic component having an electrode at an end portion thereof. The method comprises: placing a jig on a mounted body, wherein the jig includes a path inclined with respect to a pedestal including a placement surface and extending toward the pedestal; placing the mounted body on which the jig is placed on a heater block; placing an electronic component main body having the electrode on the placement surface with the electrode facing the path; rolling a ball-shaped solder in the path to reach the electrode; and melting the solder through the pedestal to attach the molten solder to the electrode.

In the method of manufacturing an electronic component, the jig is placed on the mounted body, and the mounted body is placed on the heater block. The path which is inclined toward the pedestal is formed in the jig. In the rolling step, the ball-shaped solder moves toward the electrode by rolling in the path. Thus, the solder can be positioned at a position at which it reaches the electrode. Additionally, in the melting step, the solder can be heated and melted at the position at which it reaches the electrode. In this way, the solder can always be attached to the electrode in the same molten state, and a distance for transferring the electronic component to the mounted body can be shortened.

Still another manufacturing method may be a method of manufacturing a semiconductor device which includes each of the steps in the above-described method of manufacturing an electronic component and in which the electronic component is transferred from the jig to the mounted body after the melting of the solder. In this case, since the solder can be heated and melted at the position at which it reaches the electrode, conduction failure between the electronic component and the mounted body can be reduced.

The method of manufacturing a semiconductor device may further comprises: removing the jig from the mounted body, and mounting a semiconductor element on the mounted body after the electronic component is transferred to the mounted body, wherein the semiconductor element is mounted in a region of the mounted body from which the jig is removed. In this case, an arrangement region in which the semiconductor element is disposed can be effectively used.

Details of Embodiments of the Present Disclosure

Specific examples of the method of manufacturing an electronic component according to the present disclosure will be described below with reference to the drawings. The present invention is not limited to the exemplifications but is defined by the claims and is intended to include all modifications within the meaning and scope equivalent to the claims. In the following description, the same elements or elements having the same function may be designated by the same reference numerals, and redundant description may be omitted. Further, in the drawings, an orthogonal coordinate system S defined by an X axis, a Y axis, and a Z axis is shown.

(Configuration of Semiconductor Device)

Figure 2:
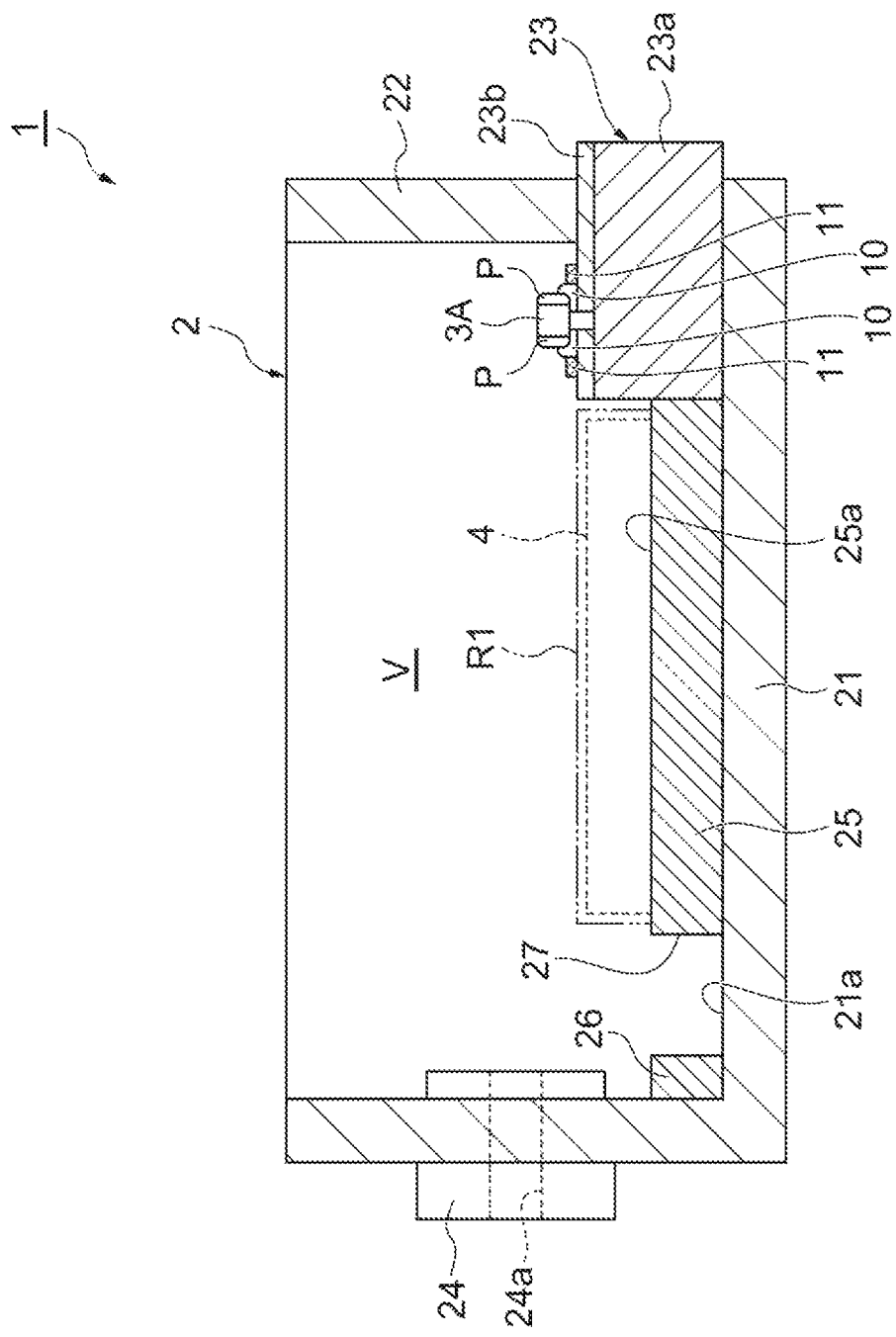
FIG. 2 is a cross-sectional view of the modulator taken along line II-II in FIG. 1.

A configuration of a semiconductor device 1 will be described with reference to FIGS. 1 and 2. FIG. 1 is a plan view showing a schematic configuration of a modulator as the semiconductor device according to an embodiment. The semiconductor device 1 may use a semiconductor element such as an integrated coherent receiver (ICR) in addition to the modulator. Although a shape of a package 2 is different (not shown), an FET may be used as the semiconductor element. FIG. 2 is a cross-sectional view taken along line II-II in FIG. 1. The semiconductor device 1 shown in FIG. 1 is a device which is operated as a modulator and modulates light input from a semiconductor laser and outputs the modulated light as an optical signal. As shown in FIGS. 1 and 2, the semiconductor device 1 includes the package 2, a plurality of (for example, four) chip capacitors 3A (first electronic components) and a plurality of (for example, two) chip capacitors 3B (second electronic components) as electronic components, and a modulator 4. In the drawing, the modulator 4 is indicated by a virtual line.

The package 2 is a member which accommodates the plurality of chip capacitors 3A and 3B and the modulator 4. The package 2 is formed of, for example, an alloy of iron, nickel, cobalt, and the like, an alloy of copper and tungsten, or a ceramic (aluminum oxide). The package 2 has a base portion 21 and a frame portion 22. The base portion 21 has a rectangular plate shape. The frame portion 22 has a rectangular ring shape and extends from a peripheral edge portion of a main surface 21a of the base portion 21 in a thickness direction (here, a Z direction) of the base portion 21. An accommodation space V for accommodating the plurality of chip capacitors 3A and 3B and the modulator 4 is formed by the base portion 21 and the frame portion 22.

A feedthrough 23 which passes through the frame portion 22 from the accommodation space V and protrudes to an external space is provided at a side portion of the package 2 on one side (the right side in FIGS. 1 and 2) in a lengthwise direction (here, an X direction). The feedthrough 23 includes a ceramic layer 23a which extends over the entire length of the package 2 in a width direction (here, a Y direction), and a plurality of metalized layers 23b which are stacked on the ceramic layer 23a and form a predetermined wiring pattern (refer to FIG. 4) for mounting the chip capacitors 3A and 3B. As an example, the ceramic layer 23a is formed of alumina Each of the metalized layers 23b is formed of, for example, a multi-film layer including titanium, platinum, and gold (Ti/Pt/Au from a bottom thereof) or tungsten. For example, lead pins (refer to, for example, FIGS. 9A to 9D) connected to a circuit (not shown) in an external space are joined to the metalized layer 23b.

As shown in FIGS. 1 and 2, a window pipe 24 which passes through the frame portion 22 and is allowed to communicate with the accommodation space V and the external space is provided at a side portion of the package 2 on the other side (the left side in FIG. 1 and FIG. 2) in the lengthwise direction. In the embodiment, two insertion holes 24a are formed in the window pipe 24. The two insertion holes 24a are arranged and disposed in a width direction of the package 2. The window pipe 24 is formed of, for example, an alloy such as Kovar or an alloy of iron and nickel.

A stage 25 for disposing the modulator 4 is provided in the accommodation space V of the package 2. The stage 25 has a rectangular plate shape including a flat support surface 25a. The stage 25 is fixed to a substantially center portion of the main surface 21a of the base portion 21. The support surface 25a constitutes a region R1 (an arrangement region) in which the modulator 4 is disposed. The feedthrough 23 is adjacent to one side of the stage 25 in the lengthwise direction of the package 2. A block 26 is disposed on the other side of the stage 25 in the lengthwise direction of the package 2. The block 26 is fixed to the frame portion 22. The stage 25 and the block 26 are adjacent to each other via a recess 27 (a first fitting portion). That is, the recess 27 located at a side of the region R1 is formed in the package 2. The base portion 21 is exposed from the recess 27. As shown in FIG. 1, a size of the recess 27 in the width direction (here, the Y direction) is larger than that of the stage 25 in the width direction (here, the Y direction). The recess 27 has a U shape which surrounds a part of the stage 25. The recess 27 has a widened portion 27a. The widened portion 27a is formed at a position at which the stage 25 is sandwiched in the width direction of the stage 25. The widened portion 27a has a shape which gradually widens in the width direction of the package 2 from an end portion of the stage 25 toward the other side of the package 2 in the lengthwise direction when seen in a direction facing the support surface 25a of the stage 25 (here, the Z direction).

A plurality of electronic components are mounted in the accommodation space V of the package 2. The electronic components are configured by the chip capacitors 3A to which solders 10 (described later) are attached or the chip capacitors 3B to which the solders 10 are attached. Each of the chip capacitors 3A and 3B has a substantially rectangular parallelepiped shape and has electrodes P at both end portions thereof in a longitudinal direction. Each of the electrodes P is formed of tin (Sn), gold (Au), or the like. In the embodiment, the chip capacitors 3A and 3B have the same size and shape. The size of the chip capacitors 3A and 3B in the longitudinal direction is twice or more that of the chip capacitors 3A and 3B in a transverse direction. As an example, the size of the chip capacitors 3A and 3B in the longitudinal direction is 0.6 mm, the size of the chip capacitors 3A and 3B in the transverse direction is 0.3 mm, and the size of the chip capacitors 3A and 3B in a height direction is 0.3 mm.

As shown in FIG. 1, each of the chip capacitors 3A is disposed so that the longitudinal direction thereof follows a first direction (here, the X direction) and has the electrodes P at both end portions thereof in the X direction. Each of the chip capacitors 3A is mounted in the package 2 by soldering the electrodes P to two metalized layers 23b adjacent to each other in the X direction. Each of the chip capacitors 3B is disposed so that the longitudinal direction thereof follows a second direction (here, the Y direction) and has electrodes P at both end portions thereof in the Y direction. Each of the chip capacitors 3B is mounted in the package 2 by soldering the electrodes P to two metalized layers 23b adjacent to each other in the Y direction.

As shown in FIGS. 1 and 2, a plurality of solders 10 and a plurality of restriction portions 11 are provided in the package 2. The solders 10 join each of the electrodes P to the metalized layer 23b. The restriction portions 11 restrict the solders 10 from rolling on the feedthrough 23. The restriction portions 11 are formed of a ceramic material such as an alumina coat. A pair of restriction portions 11 are provided on one side and the other side of each of the chip capacitors 3A and 3B. That is, each of the chip capacitors 3A and 3B is sandwiched between the pair of restriction portions 11. In the embodiment, each of the chip capacitors 3A and 3B is sandwiched between the pair of restriction portions 11 in the X direction. The pair of restriction portions 11 may sandwich any one of the plurality of chip capacitors 3A and 3B, may collectively sandwich any two or more of the plurality of chip capacitors 3A and 3B, or may collectively sandwich all of the plurality of chip capacitors 3A and 3B. In the embodiment, four chip capacitors 3A are collectively sandwiched between the pair of restriction portions 11, and each of two chip capacitors 3B is sandwiched between the pair of restriction portions 11.

The modulator 4 is disposed in the region R1 of the package 2. Specifically, the modulator 4 is fixed to the support surface 25a of the stage 25. An optical waveguide (not shown) and a plurality of pads (not shown) connected to the optical waveguide are provided in the modulator 4. The optical waveguide, for example, extends from an optical input port (not shown) as a starting point connected to one insertion hole 24a of the window pipe 24 toward one side of the package 2 in the lengthwise direction and has a shape which is folded back in a U shape and returns to an optical output port (not shown) connected to the other insertion hole 24a of the window pipe 24. Each of the pads is connected to a wiring (each of the metalized layers 23b) of the feedthrough 23 by, for example, wire bonding (not shown).

(Configuration of Jig)

Next, a configuration of a jig used when the semiconductor device 1, that is, the semiconductor device according to the embodiment, is manufactured will be described with reference to FIGS. 3 to 7. In the following description, "upper" and "lower" may be used with the Z direction as a vertical direction according to the vertical direction of the jig when the semiconductor device 1 is manufactured. FIG. 3 is a perspective view showing a schematic configuration of the jig according to the embodiment. The jig 5 shown in FIG. 3 is used when the electrodes P of the chip capacitors 3A and 3B are soldered to the metalized layers 23b of the package 2 in the process of manufacturing the semiconductor device 1. The jig 5 has a substantially rectangular plate shape and is formed of a material to which the solders do not easily attach (for example, stainless steel: an alloy of chromium and nickel, alumina: an aluminum oxide, aluminum, or the like).

Figure 4:
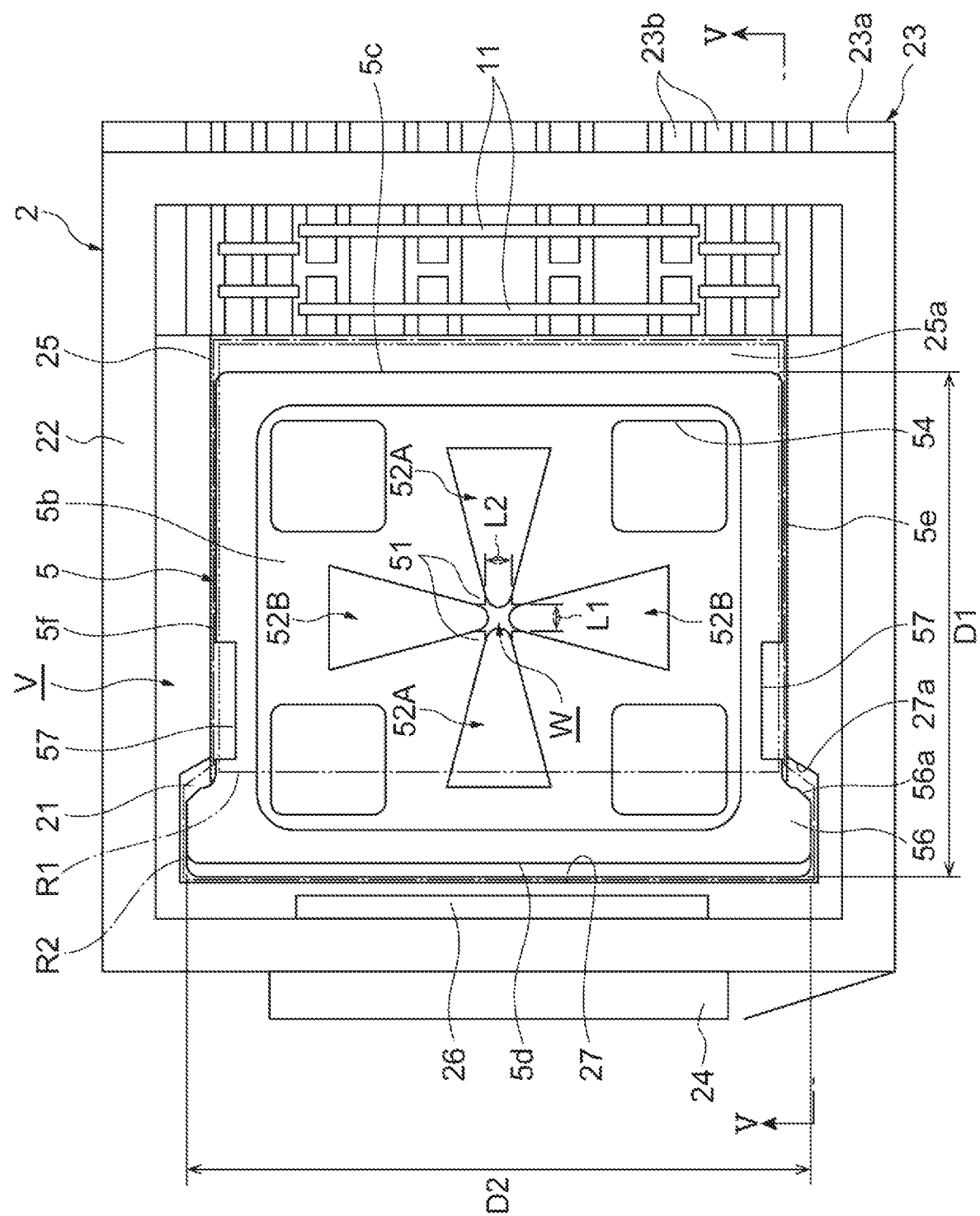
FIG. 4 is a plan view of the jig shown in FIG. 3 when seen from above.
Figure 5:
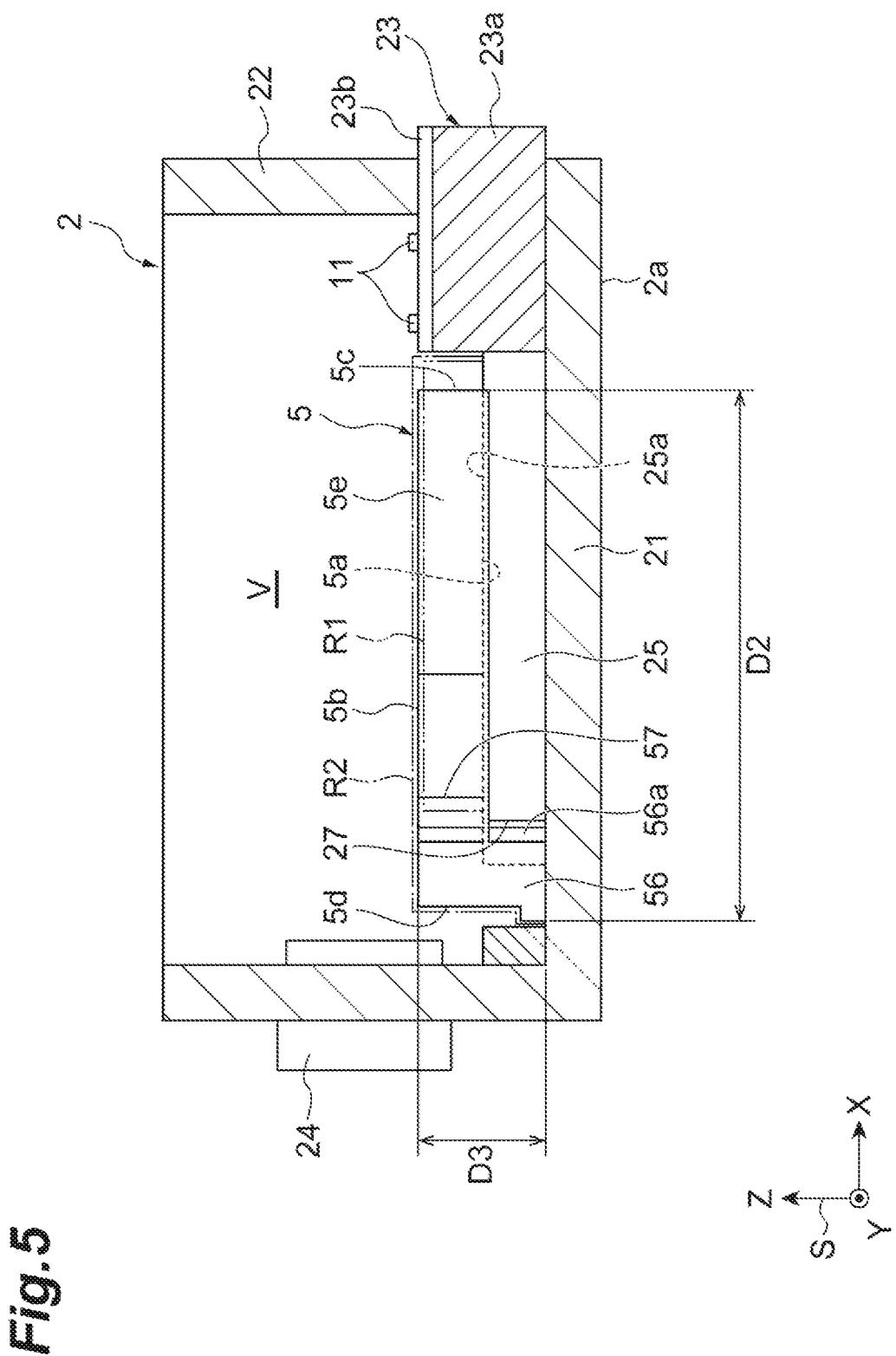
FIG. 5 is a cross-sectional view of the jig taken along line V-V in FIG. 4.
Figure 6:
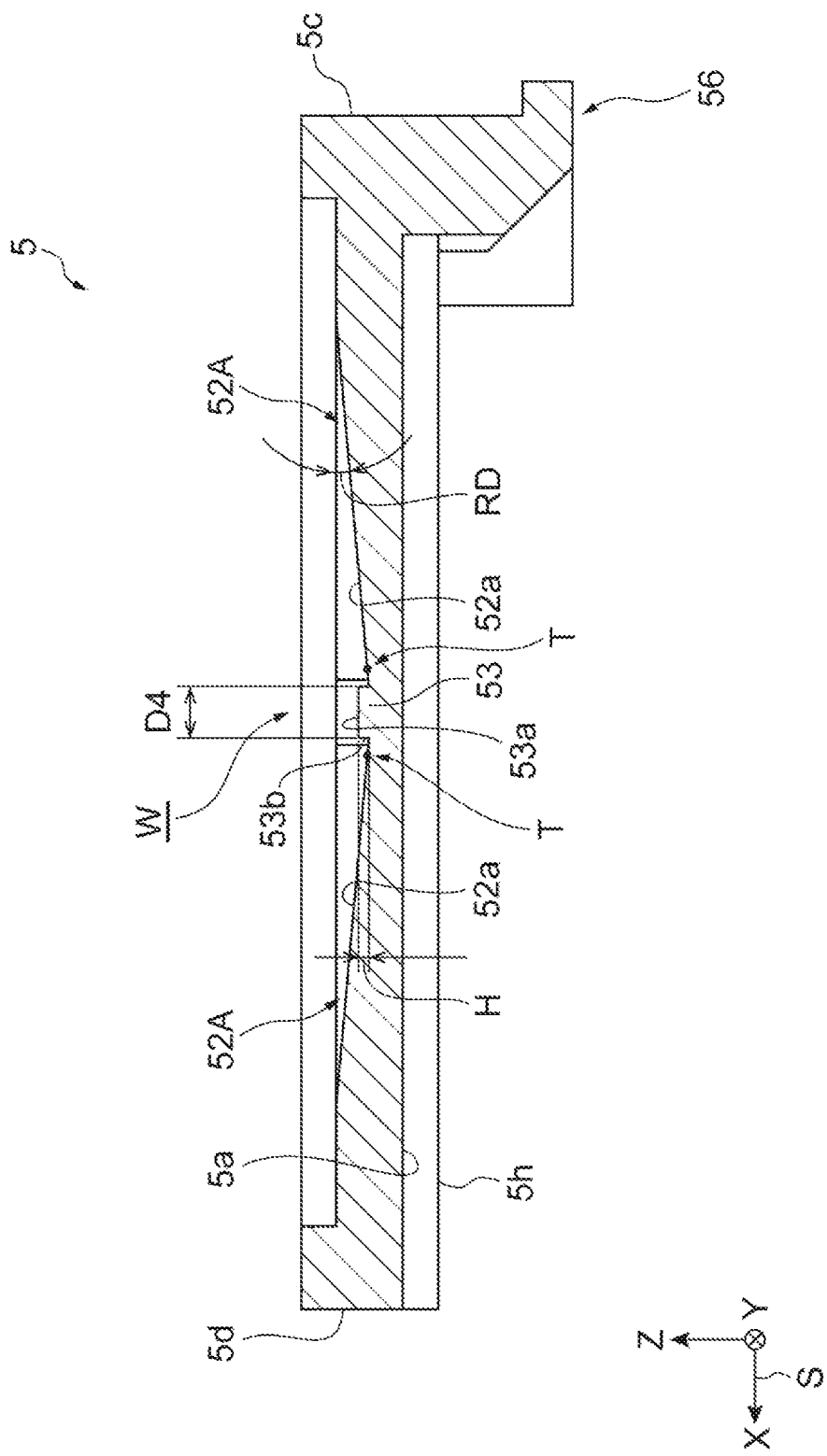
FIG. 6 is a cross-sectional view of the jig taken along line VI-VI in FIG. 3.

FIG. 4 is a plan view of the jig 5 shown in FIG. 3 when seen from above. FIG. 5 is a cross-sectional view taken along line V-V in FIG. 4. FIG. 6 is a cross-sectional view taken along line VI-VI in FIG. 3. FIGS. 4 and 5 show a state in which the jig 5 is placed on the package 2. In FIG. 5, a front side of the stage 25 in the package 2 is omitted. As shown in FIGS. 4 and 5, the jig 5 is placed in a region R2 (a placement region) which extends from the region R1 to the recess 27 in the package 2. As an example, a size of the jig 5 is larger than that of the modulator 4 and smaller than that of the accommodation space V of the package 2. In the embodiment, the region R2 in which the jig 5 is placed includes the entire region R1. The region R2 may not include the entire region R1 and may include at least a part of the region R1.

In a maximum exterior of the jig 5, a size D1 in a lengthwise direction (the same direction as the lengthwise direction of the package 2, and here, the X direction) may be, for example, 3 mm or more and 30 mm or less, and is 8.0 mm or 10 mm as an example. A size D2 of the jig 5 in a width direction (the same direction as the width direction of the package 2, and here, the Y direction) may be, for example, 3 mm or more and 30 mm or less, and is 9.0 mm or 10 mm as an example. In the maximum exterior of the jig 5, a size D3 of the jig 5 in a thickness direction (the same direction as the thickness direction of the base portion 21 of the package 2, and here, the Z direction) may be, for example, 1.3 mm or more and 2.5 mm or less, and is 1.5 mm or 2 mm as an example.

The jig 5 includes a bottom surface 5a located adjacent to the base portion 21 of the package 2, a main surface 5b located on the side opposite to the bottom surface 5a, and side surfaces 5c, 5d, 5e, and 5f in a state in which it is placed on the package 2. The side surfaces 5c and 5d face each other in the lengthwise direction of the jig 5, and in the state in which it is placed on the package 2, the side surface 5c is located on the side on which the feedthrough 23 is provided, and the side surface 5d is located on the side on which the window pipe 24 is provided. The side surfaces 5e and 5f face each other in the width direction of the jig 5.

As shown in FIGS. 3 and 4, a plurality of (here, four) protrusions 51 and a plurality of (here, four) paths (paths 52A and 52B) are provided on the main surface 5b of the jig 5. The plurality of protrusions 51 hold the chip capacitors 3A and 3B. That is, the jig 5 has a holding portion which holds the chip capacitors 3A and 3B. The plurality of protrusions 51 form a holding space W for holding the chip capacitors 3A and 3B at a center portion of the main surface 5b. The plurality of protrusions 51 extend from each of four corners of the main surface 5b when seen from above toward a center of the main surface 5b when seen from above and face each other through the holding space W. The holding portion is formed by tip ends (end portions of the protrusions 51 in a direction which faces the holding space W) of the plurality of protrusions 51.

In the embodiment, the plurality of protrusions 51 have the same size and shape. A distance L1 between the tip ends of the protrusions 51 adjacent to each other in a first direction (here, the X direction) is slightly larger than that of the chip capacitor 3A in the transverse direction and smaller than that of the chip capacitor 3B in the longitudinal direction. A distance L2 between the tip ends of the protrusions 51 adjacent to each other in a second direction (here, the Y direction) is slightly larger than that of the chip capacitor 3B in the transverse direction and smaller than that of the chip capacitor 3A in the longitudinal direction. In the embodiment, the distances L1 and L2 are the same as each other, may be, for example, less than 0.5 mm and 0.35 mm or more, and are 0.40 mm as an example.

The plurality of paths include a plurality of (here, two) paths 52A (first paths) which extend in the X direction and a plurality of (here, two) paths 52B (second paths) which extend in the Y direction. Each of the paths 52A and 52B is allowed to communicate with the holding space W. The two paths 52A are located with the holding space W interposed therebetween in the X direction, and the two paths 52B are located with the holding space W interposed therebetween in the Y direction. In other words, the plurality of paths 52A and 52B have a cross shape as a whole.

Each of the two paths 52A is formed by a space between two protrusions 51 adjacent to each other in the Y direction. Each of the two paths 52B is formed by a space between two protrusions 51 adjacent to each other in the X direction. As shown in FIGS. 3 and 4, in the embodiment, a region which surrounds the plurality of paths 52A and 52B and a region in which the plurality of protrusions 51 are formed are flush with each other. Each of the paths 52A and 52B is formed by a groove which is recessed to be inclined downward toward the holding space W. In addition, since the plurality of paths 52A and 52B are formed by the plurality of grooves, the protrusions 51 are formed by two adjacent grooves. All the paths 52A and 52B open upward (toward the accommodation space V in the state in which the jig 5 is placed on the package 2).

Widths (a space between the two protrusions 51) of the paths 52A and 52B become narrower toward the holding space W. The widths of the paths 52A and 52B are reduced to, for example, ⅓ to ⅙ from starting points (portions farthest from the holding space W) of the paths 52A and 52B toward the holding space W, and they are reduced to, for example, about ¼. In the embodiment, the widths of the paths 52A and 52B are continuously narrowed toward the holding space W. The width of the paths 52A and 52B may be reduced stepwise toward the holding space W, and in this case, they may be formed to become narrower in stages smaller than a diameter of the ball-shaped solder 10 which will be described later.

As shown in FIGS. 3 and 6, in the state in which the jig 5 is placed on the package 2, bottom surfaces 52a of the paths 52A and 52B are inclined downward with respect to a bottom surface 2a (a surface which is substantially parallel to a horizontal surface on which the package 2 is placed, and here, a surface which is substantially parallel to an XY plane) of the package 2 toward the holding space W. That is, in the state in which the jig 5 is placed on the package 2, a height of the bottom surface 52a of each of the paths 52A and 52B is lowest at a position which communicates with the holding space W. In other words, the paths 52A and 52B are deepest at an end point T which communicates with the holding space W. In the embodiment, an inclination angle of the bottom surface 52a with respect to the bottom surface 2a may be, for example, 3° or more and less than 15°, and is 5° as an example.

Figure 7:
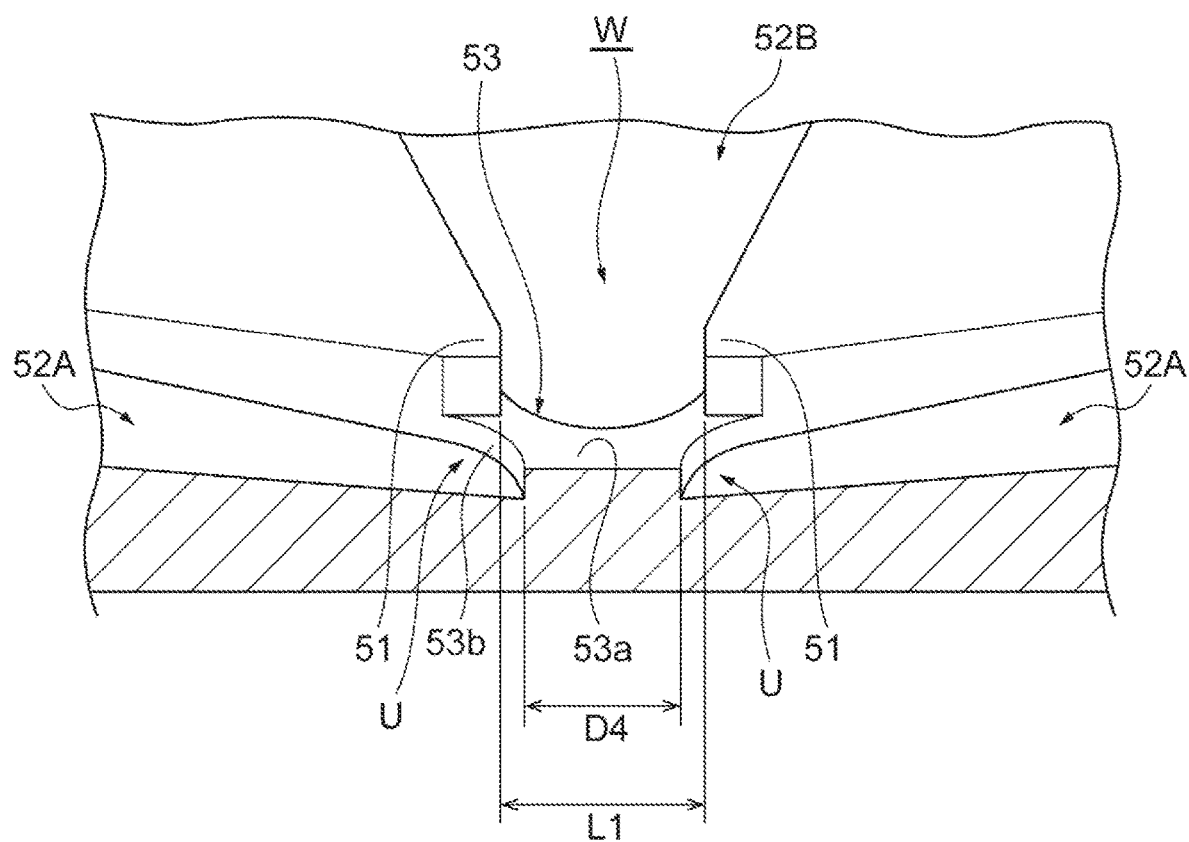
FIG. 7 is an enlarged cross-sectional perspective view showing the vicinity of a pedestal of the jig.

As shown in FIGS. 3 and 6, the jig 5 has a pedestal 53. The pedestal 53 is formed between the end points T of the two paths 52A and between the end points T of the two paths 52B. FIG. 7 is an enlarged cross-sectional perspective view showing the vicinity of the pedestal 53 of the jig. As shown in FIGS. 6 and 7, the pedestal 53 includes a placement surface 53a on which the chip capacitors 3A and 3B are mounted, and a plurality of side surfaces 53b which extend from the bottom surface 52a of each of the paths 52A and 52B to the placement surface 53a.

The placement surface 53a is a flat surface which is substantially parallel to the bottom surface 2a in the state in which the jig 5 is placed on the package 2. A size D4 of a center portion of the placement surface 53a in the width direction (here, the X direction and the Y direction) is smaller than that of each of the chip capacitors 3A and 3B in the longitudinal direction. Thus, when the chip capacitors 3A and 3B are disposed in the holding space W, a part (for example, the center portion) of each of the chip capacitors 3A and 3B in the longitudinal direction is placed on the center portion of the placement surface 53a. The size D4 is, for example, shorter than the distances L1 and L2 (refer to FIG. 4) between the tip ends of the adjacent protrusions 51 and is 0.3 mm as an example. A height H of the placement surface 53a with respect to the bottom surface 52a at the end point T is smaller than, for example, the diameter of a ball-shaped solder 10 which will be described later and is 0.1 mm as an example.

The plurality of side surfaces 53b connect the tip ends of the protrusions 51 adjacent to each other in the X direction and connect the tip ends of the protrusions 51 adjacent to each other in the Y direction. The plurality of side surfaces 53b have the same size and shape, for example. The plurality of side surfaces 53b include two side surfaces 53b which face each other in the X direction and two side surfaces 53b which face each other in the Y direction. The two side surfaces 53b which face each other in the X direction have curved surface shapes which are curved in a direction in which they approach each other as they go toward center portions of the side surfaces 53b in the Y direction. Similarly, the two side surfaces 53b which face each other in the Y direction have curved surface shapes which are curved in a direction in which they approach each other as they go toward center portions of the side surfaces 53b in the X direction. That is, each of the side surfaces 53b forms a gap U, and a width of the gap U becomes narrower from the end point T of each of the paths 52A and 52B further toward the holding space W.

Returning to FIG. 3 and FIG. 4, a plurality of (here, four) recesses 54 and a frame portion 55 are further provided on the main surface 5b of the jig 5. The plurality of recess 54 are provided at positions spaced apart from the holding space W and the paths 52A and 52B. The four recesses 54 are respectively located at four corners of the main surface 5b when seen from above. The frame portion 55 restricts respective components (for example, the chip capacitors 3A and 3B, and the ball-shaped solders 10) placed on the main surface 5b from dropping outside the main surface 5b. The frame portion 55 is a portion which surrounds respective portions (the protrusions 51, the paths 52A and 52B, the pedestal 53, and the recesses 54) formed on the main surface 5b. The frame portion 55 extends over the entire circumference of the peripheral edge portion of the main surface 5b when seen from above and protrudes opposite to the bottom surface 5a.

As shown in FIG. 5, the bottom surface 5a of the jig 5 faces the support surface 25a of the stage 25 when the jig 5 is placed on the package 2. On the jig 5, a protruding portion 56 (a second fitting portion) is formed on the bottom surface 5a. When the jig 5 is placed on the stage 25 of the package 2, the protruding portion 56 protrudes downward from the bottom surface 5a further than the support surface 25a of the stage 25 and fits into the recess 27 of the package 2. Thus, a thickness of the jig 5 on the side surface 5d is larger than that of the jig 5 on the side surface 5c. The protruding portion 56 is provided at a position corresponding to the recess 27 and has a size and shape corresponding to that of the recess 27. As shown in FIGS. 4 and 5, a size of the protruding portion 56 in the X direction is slightly smaller than that of the recess 27 in the X direction. A size of the protruding portion 56 in the Y direction is slightly smaller than that of the recess 27 in the Y direction. The protruding portion 56 has a widened portion 56a which widens corresponding to the widened portion 27a of the recess 27 when seen in a direction which it faces the support surface 25a of the stage 25.

Returning to FIGS. 3 to 5, a depressed portion 57 which is recessed stepwise in a direction in which it approaches the side surface 5f is formed in the side surface 5e of the jig 5. Similarly, a depressed portion 57 which is recessed in a direction in which it approaches the side surface 5e is formed in the side surface 5f of the jig 5. The depressed portions 57 of the side surfaces 5e and 5f are located to face each other in the Y direction. A position of each of the depressed portion 57 in the X direction coincides with a center of gravity of the jig 5 in the X direction.

(Method of Manufacturing Electronic Component)

Figure 8:
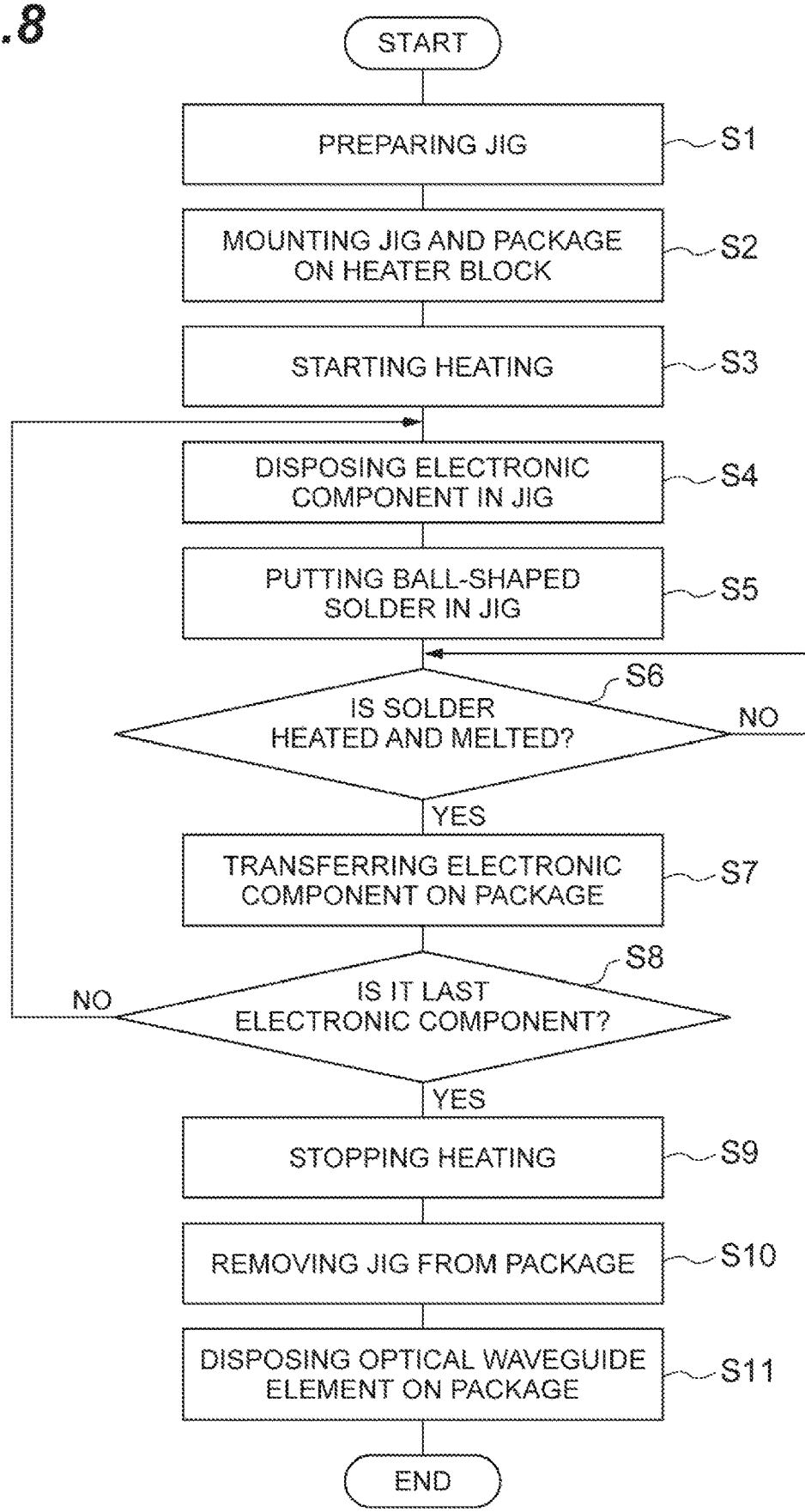
FIG. 8 is a flowchart showing a procedure of a method of manufacturing an electronic component.

Next, a method of manufacturing the above-described semiconductor device 1 will be described as a method of manufacturing an electronic component according to the embodiment with reference to FIGS. 8 to 16. FIG. 8 is a flowchart showing a procedure of the method of manufacturing an electronic component. FIG. 9A to FIG. 9D are schematic views showing respective steps of the method of manufacturing an electronic component.

As shown in FIG. 8, Step S1 is performed at the beginning in the method of manufacturing an electronic component. In Step S1, the above-described jig 5 is prepared. At this time, the above-described package 2 is prepared together with the jig 5, and the jig 5 is placed on the package 2. For example, an operation is performed manually by gripping the jig 5 with tweezers (not shown). The jig 5 is gripped by gripping the depressed portions 57 of the side surfaces 5e and 5f with the tweezers. Then, as shown in FIGS. 4 and 5, the jig 5 is placed in the region R2 of the package 2. The bottom surface 5a is disposed on the support surface 25a of the stage 25 of the package 2, and the recess 27 of the package 2 and the protruding portion 56 of the jig 5 are fitted to each other. Lead pins L may be connected to the package 2.

Figure 9A:
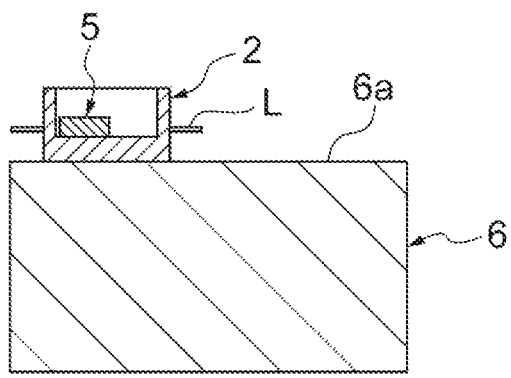
FIGS. 9A to 9D are schematic diagrams showing respective steps in the method of manufacturing the electronic component.

Next, Step S2 is performed. As shown in FIG. 9A, in Step S2, the jig 5 and the package 2 prepared in Step S1 are mounted on the heater block 6. At this time, the jig 5 and the package 2 are attracted and held by the heater block 6. A surface 6a of the heater block 6 on which the jig 5 and the package 2 are mounted is, for example, substantially parallel to a horizontal plane (that is, an XY plane). At this time, the jig 5 is maintained in a certain posture. Further, the jig 5 is in a state in which it is placed on the package 2. The same applies to the subsequent steps. In the embodiment, the process is performed up to Step S9 which will be described later in the state in which the jig 5 is placed on the package 2 and the jig 5 is maintained in the certain posture. Thus, until Step S9, the bottom surfaces 52*a* of the paths 52A and 52B of the jig 5 are inclined downward with respect to the horizontal plane toward the holding space W (refer to FIGS. 3 and 6).

Next, Step S3 is performed. In Step S3, heating of the heater block 6 is started. For example, the heater block 6 is set so that the surface 6*a* of the heater block 6 rises to a predetermined temperature, for example 230° C. in the embodiment, and waits until a predetermined time elapses. In the following steps, the surface 6*a* of the heater block 6 is maintained at a predetermined temperature until the heating is stopped. The jig 5 may be placed on the heater block 6 heated in advance, and the package 2 may be mounted on the jig 5.

Figure 9B:
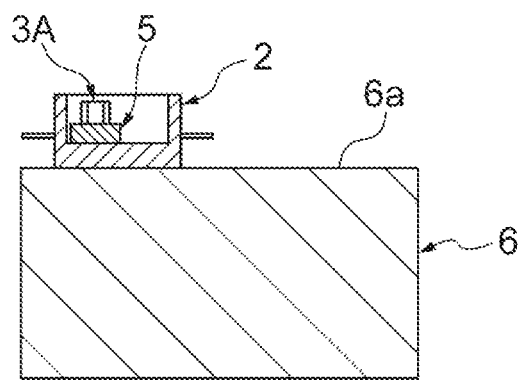
Figure 10A:
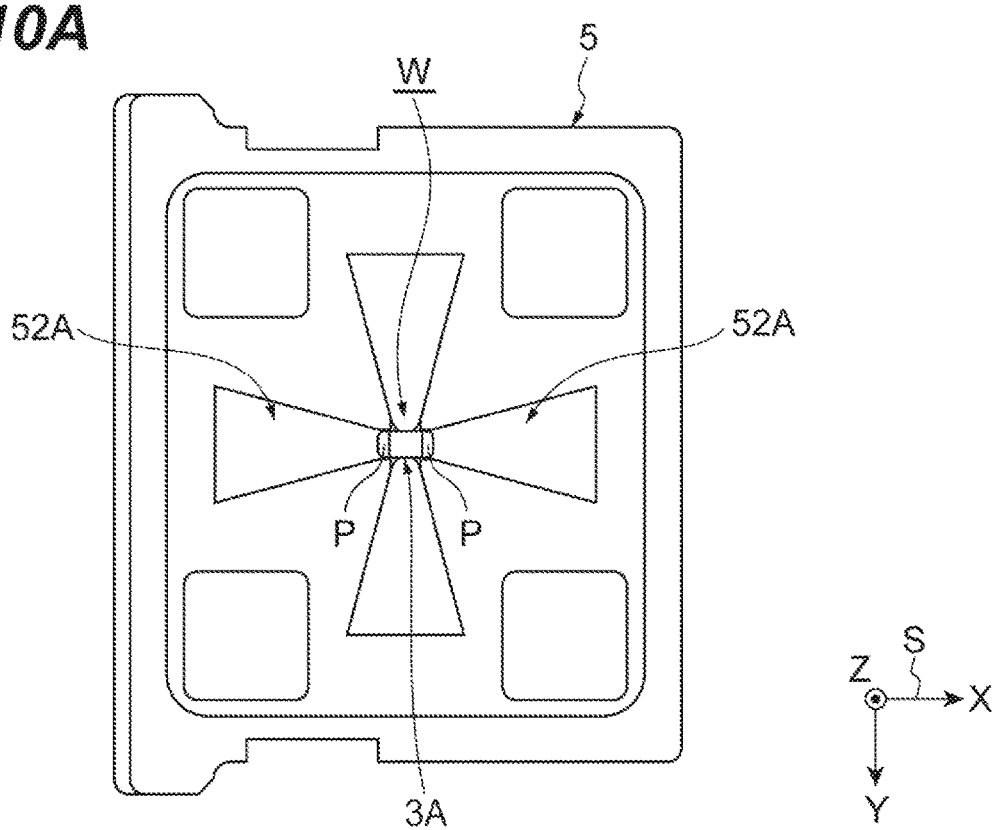
FIG. 10A is a plan view of the jig shown in FIG. 9B when seen from above.
Figure 10B:
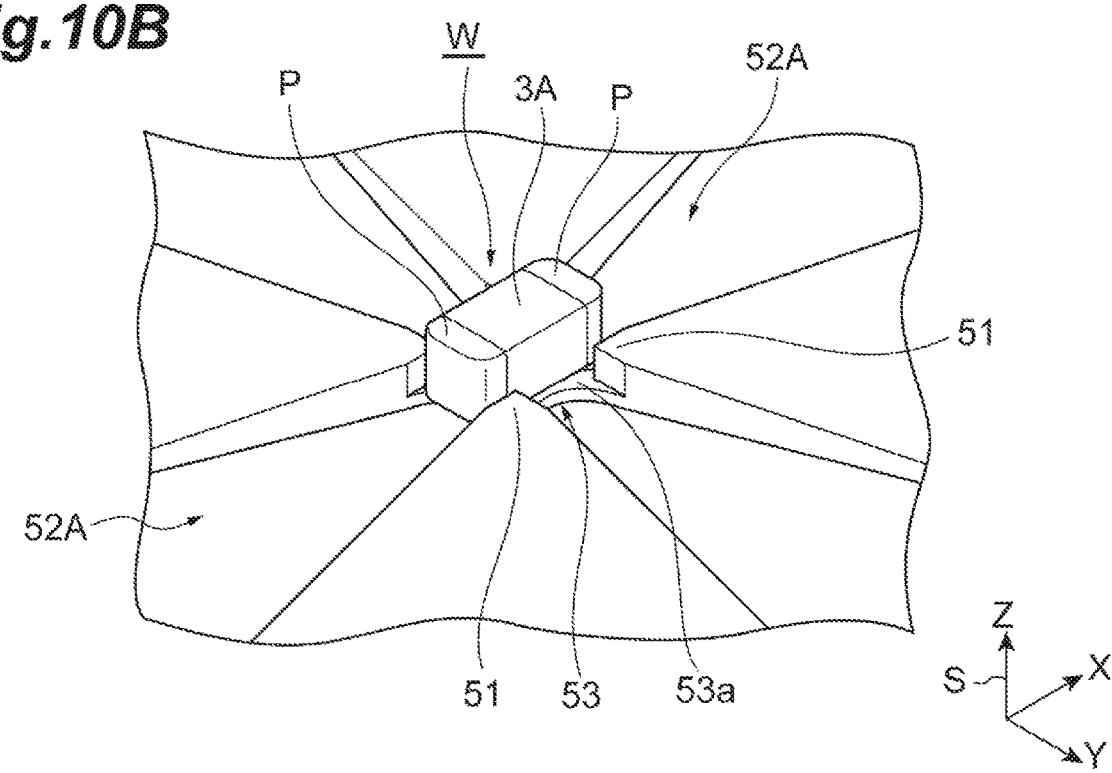
FIG. 10B is an enlarged perspective view showing the vicinity of the pedestal of the jig.

Next, Step S4 is performed. First, the above-described chip capacitor 3A is mounted in the package 2 in the embodiment. In Step S4, as shown in FIG. 9B, the chip capacitor 3A as an electronic component main body is disposed on the jig 5. The operation is performed manually by gripping the chip capacitor 3A with tweezers. FIG. 10A is a plan view of the jig 5 shown in FIG. 9B when seen from above. FIG. 10B is an enlarged perspective view showing the vicinity of the pedestal 53 of the jig 5. As shown in FIGS. 10A and 10B, when the chip capacitor 3A is mounted, the chip capacitor 3A is disposed in the holding space W in a state in which the electrodes P face the two paths 52A. A center portion of the chip capacitor 3A is placed on the placement surface 53*a* of the pedestal 53.

Figure 9C:
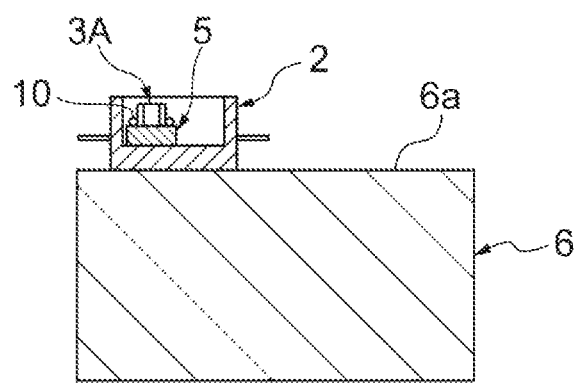
Figure 11A:
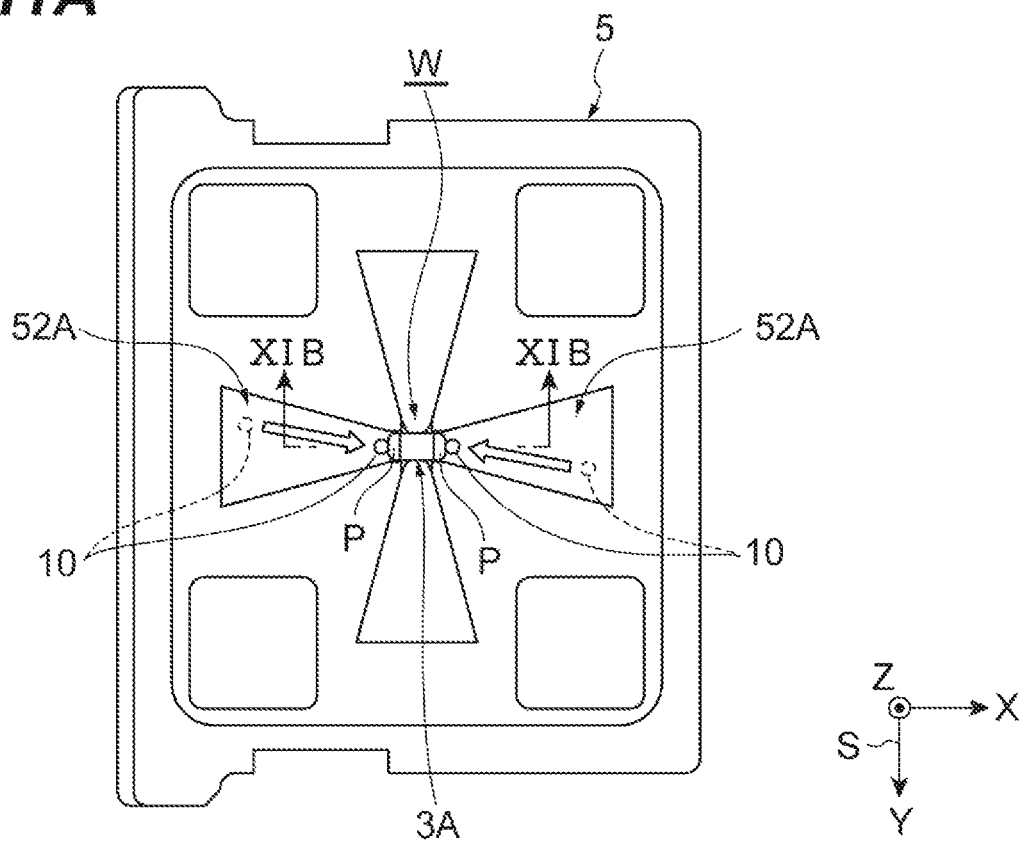
FIG. 11A is a plan view of the jig shown in FIG. 9C when seen from above.
Figure 11B:
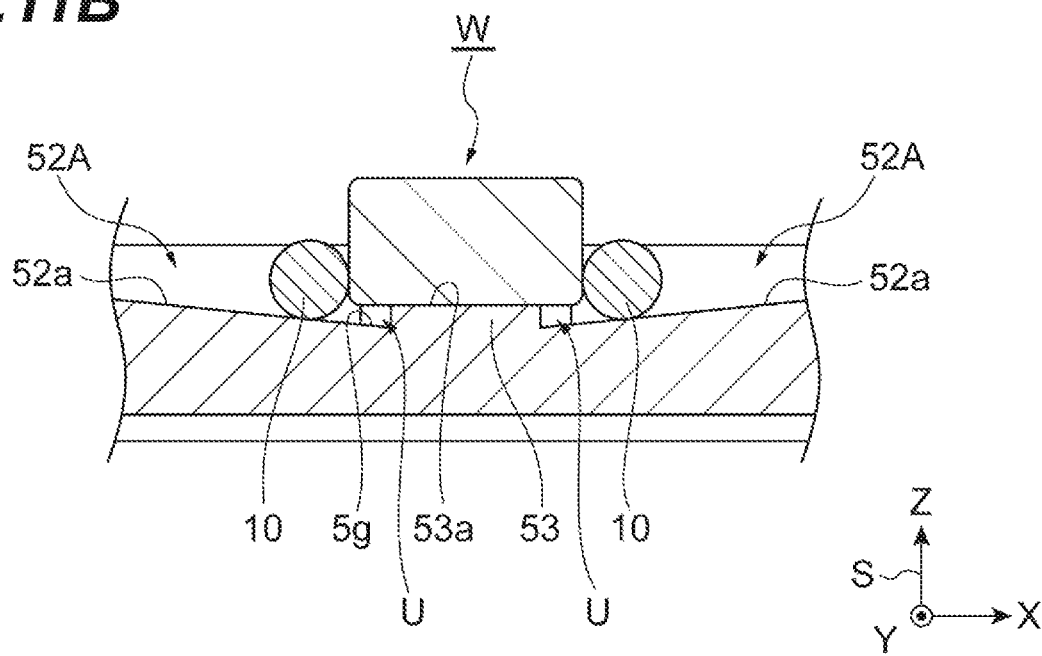
FIG. 11B is a cross-sectional view taken along line XIB-XIB in FIG. 11A.
Figure 12:
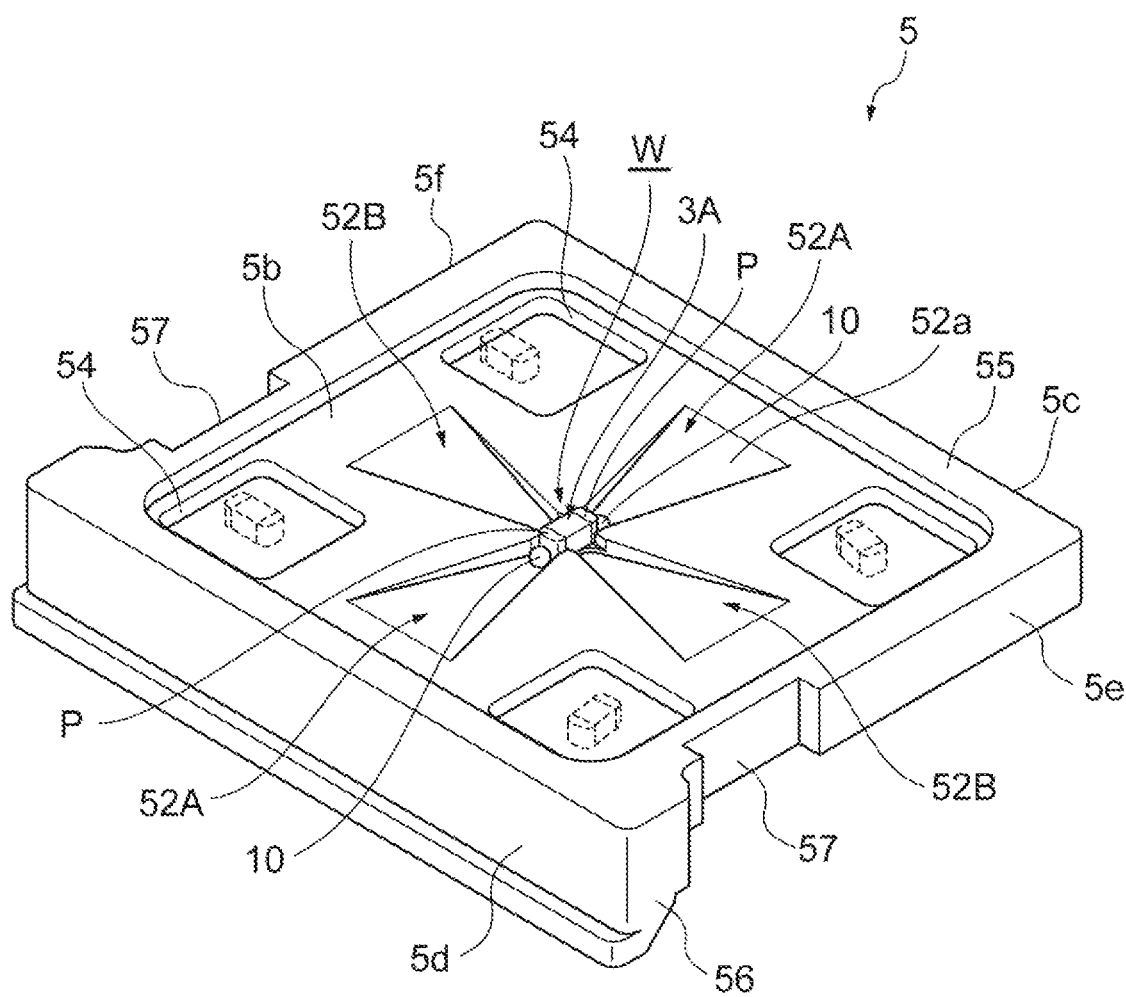
FIG. 12 is a perspective view showing a state in which solders reach respective electrodes.

Next, Step S5 is performed. In Step S5, as shown in FIG. 9C, the ball-shaped solders 10 are put into the jig 5. FIG. 11A is a plan view of the jig 5 shown in FIG. 9C when seen from above. FIG. 11B is a cross-sectional view taken along line XIB-XIB in FIG. 11A. FIG. 12 is a perspective view showing a state in which the solders 10 reach the electrodes P. As shown in FIGS. 11A and 11B and FIG. 12, in Step S5 when the chip capacitor 3A is mounted, the ball-shaped solders 10 are rolled along the path 52A, and the solders 10 reach the electrodes P of the chip capacitor 3A. The solders 10 are gripped with tweezers and manually moved to place the solder 10 on the starting point in the path 52A, and thus the solders 10 roll along the path 52A.

At this time, the solders 10 roll along each of the two paths 52A and reach each of the electrodes P. A size of the solder 10 is, for example, about 0.2 mm in diameter. As shown in FIG. 11B, the jig 5 has a facing surface 5*g* which faces the electrode P. The facing surface 5*g* is located below the placement surface 53*a* of the pedestal 53. Thus, when the solders 10 reach the electrodes P, the gap U formed by the pedestal 53 is maintained by the electrodes P and the facing surface 5*g*.

In this state, Step S6 is performed. In Step S6, the process waits until the solders 10 are melted while the solders 10 are heated. For example, the process waits until a predetermined time (in the embodiment, about 5 seconds) elapses. When the predetermined time elapses, the solders 10 are melted, and the chip capacitor 3A is in a state in which the solders are attached to the electrodes P. At this time, a part of each of the melted solders 10 flows into the gap U, and the chip capacitor 3A is in a state in which the solders 10 are also attached to a bottom surface Pa (refer to FIG. 13B) of each of the electrodes P. Thus, an electronic component (that is, an electronic component main body to which the solders 10 are attached) is manufactured.

Figure 9D:
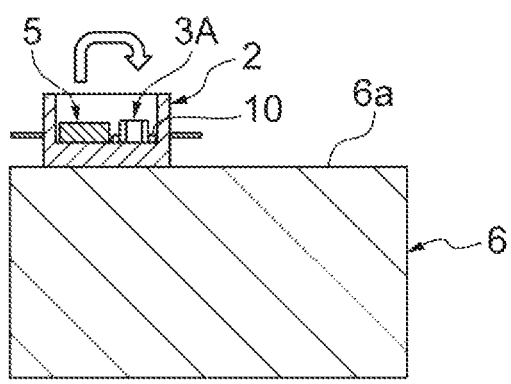

Step S7 is performed in a state in which the solders 10 heated and melted are attached to the electrodes P. In Step S7, as shown in FIG. 9D, the chip capacitor 3A is transferred to a predetermined mounting position in the package 2. At this time, the melted solders 10 are attached to each of the electrodes P. The operation is performed manually by gripping the chip capacitor 3A with tweezers. The transfer may be performed after a state of the solders 10 attached to the electrodes P is adjusted using the recess 54 of the jig 5 as indicated by a broken line in FIG. 12. The state of the solders 10 is adjusted by removing an excess amount of the solders 10 attached to the electrodes P, finely adjusting the positions of the solders 10 with respect to the electrodes P, or adjusting wettability of the solders 10 using an edge, a side surface, or a bottom surface of the recess 54.

Figure 13A:
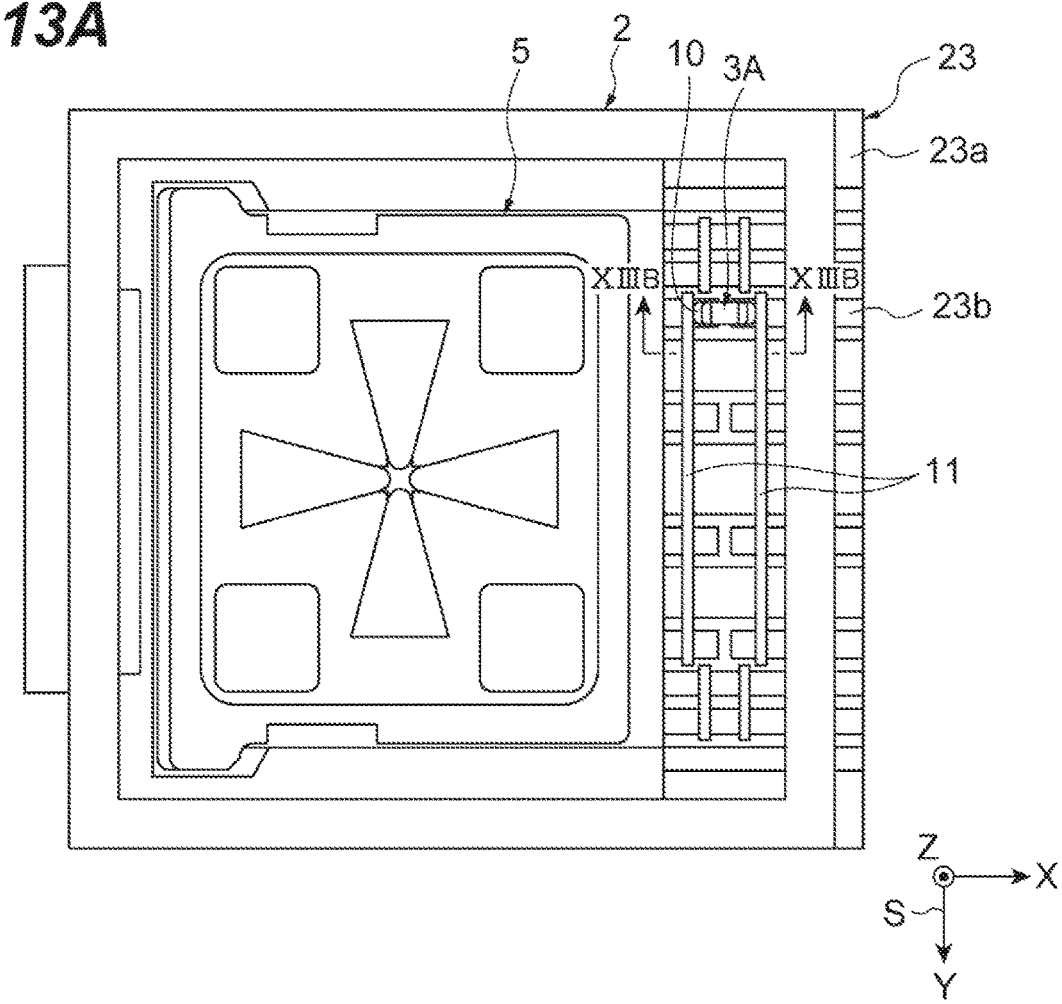
FIG. 13A is a plan view of a package and the jig shown in FIG. 9D when seen from above.
Figure 13B:
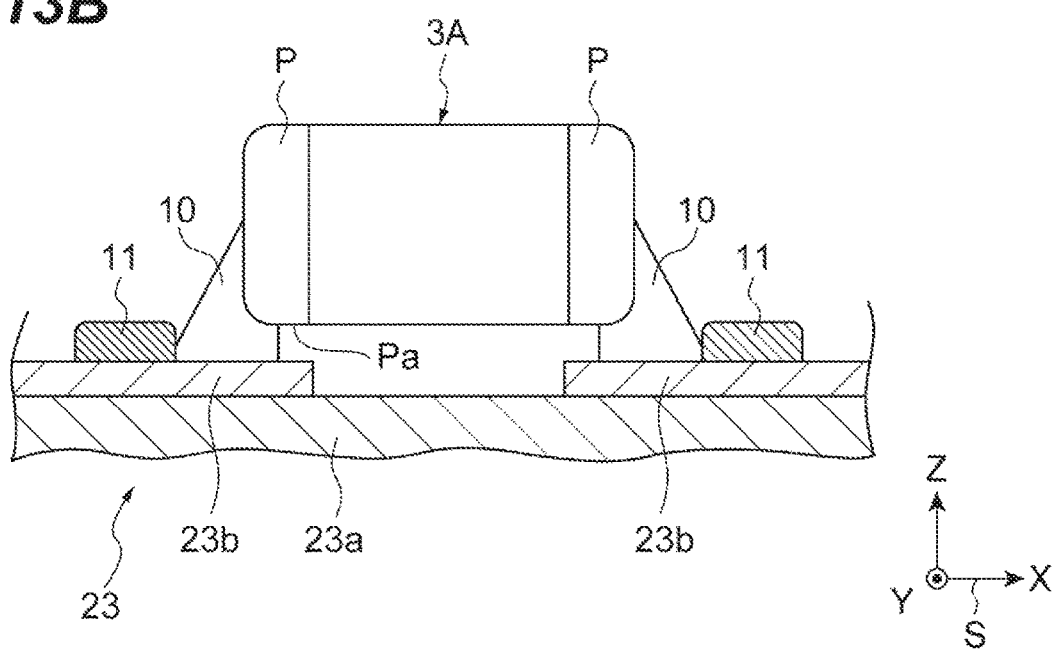
FIG. 13B is a cross-sectional view taken along line XIIIB-XIIIB in FIG. 13A.

FIG. 13A is a plan view of the package 2 and the jig 5 shown in FIG. 9D when seen from above. FIG. 13B is a cross-sectional view taken along line XIIIB-XIIIB in FIG. 13A. As shown in FIGS. 13A and 13B, the chip capacitor 3A transferred to the mounting position (for example, on the two metalized layers 23*b* adjacent to each other in the X direction) is solder-connected to the metalized layer 23*b* of the feedthrough 23 in the same posture as that in the state in which it is disposed in the holding space W of the jig 5.

Next, Step S8 is performed. In Step S8, it is confirmed whether or not the chip capacitor 3A transferred to the mounting position in Step S7 is the last electronic component among the electronic components mounted in the package 2 by a solder connection of the electrodes P. When it is not the last electronic component, the process returns to Step S4. Thereafter, Steps S4 to S7 are repeated until Step S7 for the last electronic component is completed.

Figure 14A:
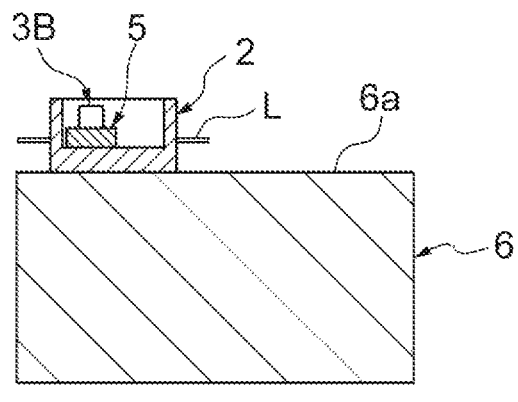
FIGS. 14A to 14C are schematic diagrams showing respective steps in the method of manufacturing an electronic component.
Figure 14B:
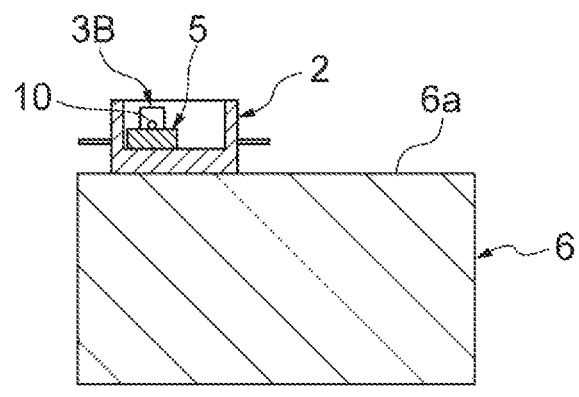
Figure 14C:
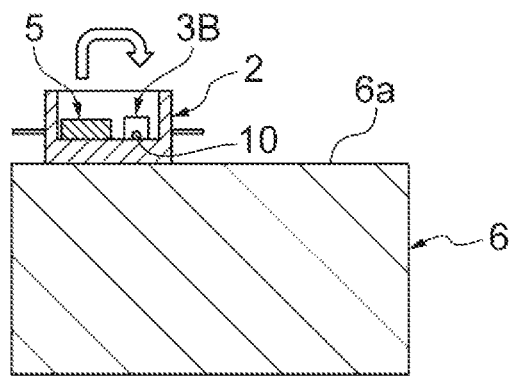
Figure 15A:
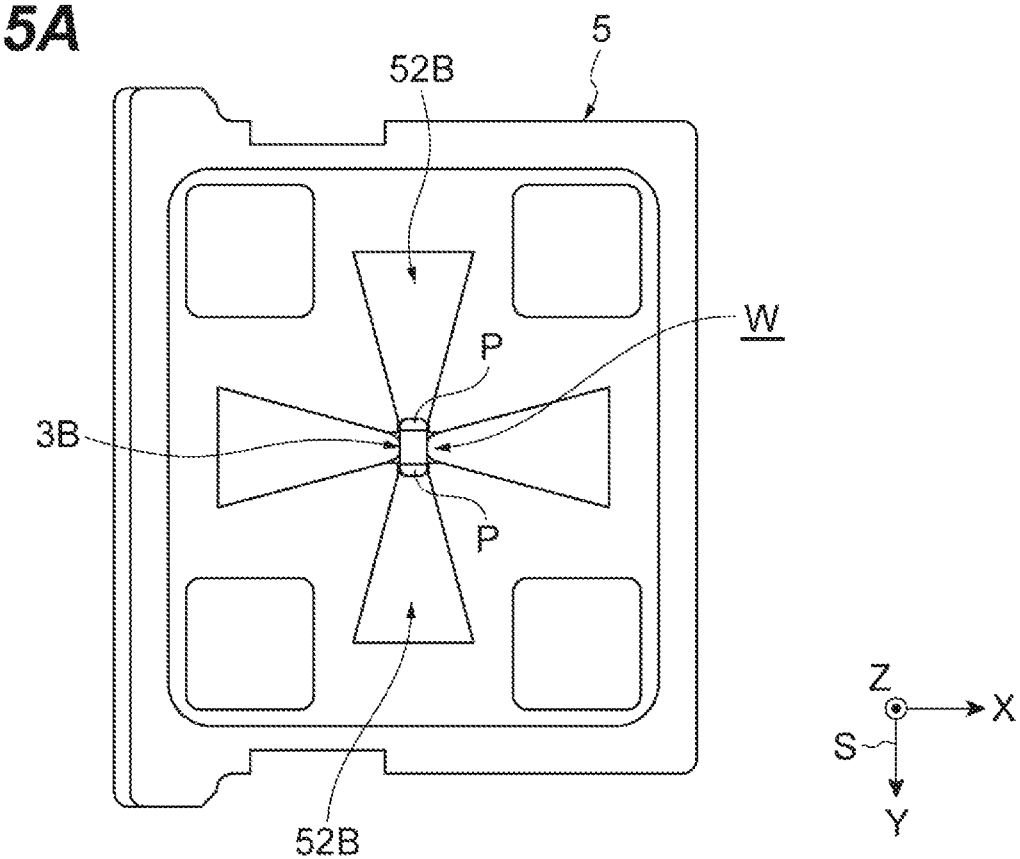
FIG. 15A is a plan view of the jig shown in FIG. 14A when seen from above.

In the embodiment, as next Steps S4 to S7, respective steps when the above-described chip capacitor 3B is mounted in the package 2 are performed. FIG. 14A to FIG. 14D are schematic views showing the respective steps when the chip capacitor 3B is mounted. In Step S4, as shown in FIG. 14A, the chip capacitor 3B as the electronic component main body is disposed on the jig 5. FIG. 15A is a plan view of the jig 5 shown to FIG. 14A when seen from above. As shown in FIG. 15A, when the chip capacitor 3B is mounted, in Step S4, the chip capacitor 3B is manually disposed in the holding space W with the electrode P facing the path 52B. At this time, the chip capacitor 3B is disposed in a state in which the electrodes P respectively face the two paths 52B. A center portion of the chip capacitor 3B is placed on the placement surface 53*a* of the pedestal 53.

Figure 15B:
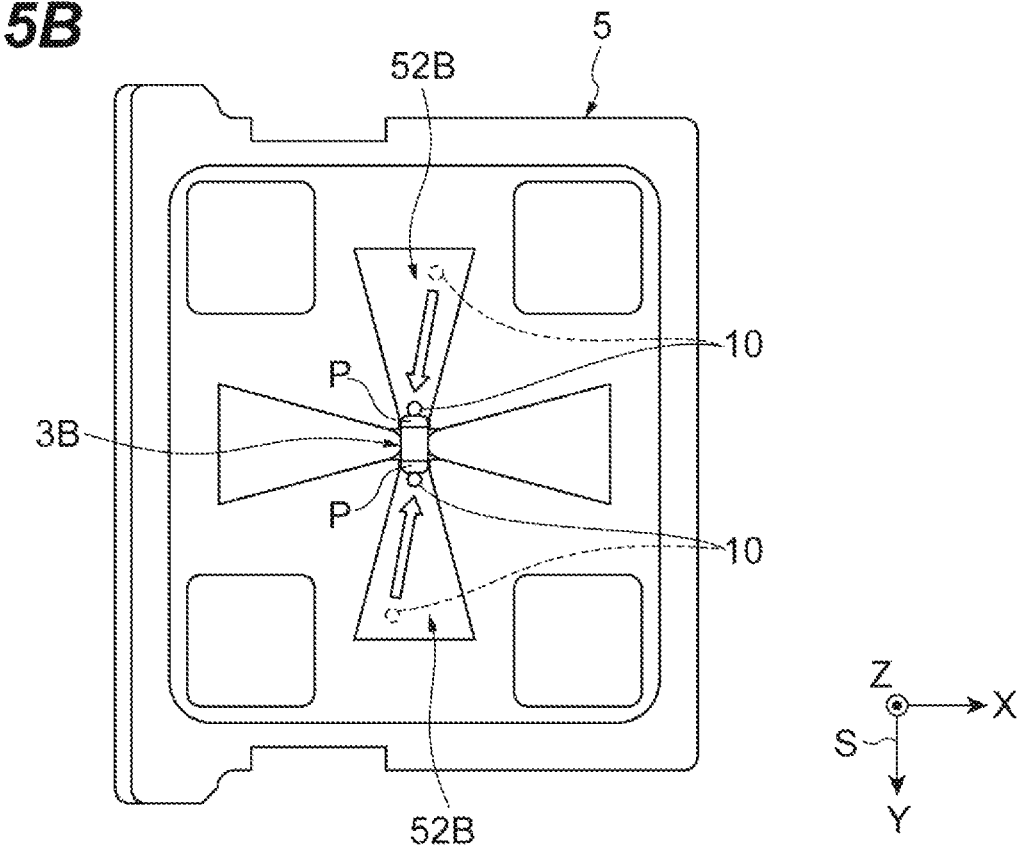
FIG. 15B is a plan view of the jig shown in FIG. 14B when seen from above.

Next, Step S5 is performed. In Step S5, as shown in FIG. 14B, the ball-shaped solders 10 are put into the jig 5. FIG. 15B is a plan view of the jig 5 shown in FIG. 14B when seen from above. As shown in FIG. 15B, in Step S5 when mounting the chip capacitor 3B, the solders 10 roll along the paths 52B and reach the electrodes P of the chip capacitor 3B. The solders 10 are gripped with tweezers and manually moved to place the solder 10 on the starting point in the path 52B, and thus the solders 10 roll along the path 52B. At this time, the solders 10 roll along each of the two paths 52B and reach each of the electrodes P.

Next, Steps S6 and S7 are performed in order. Step S6 is the same as Step S6 when the above-described chip capacitor 3A is mounted. In Step S7, the chip capacitor 3B is transferred to a predetermined mounting position in the package 2 as shown in FIG. 14C. At this time, the melted solders 10 are attached to each of the electrodes P. As in Step S6 when the above-described chip capacitor 3A is mounted, after the state of the solders 10 attached to the electrodes P is adjusted using the recess 54 of the jig 5, the chip capacitor 3B may be transferred to the mounting position.

Figure 16:
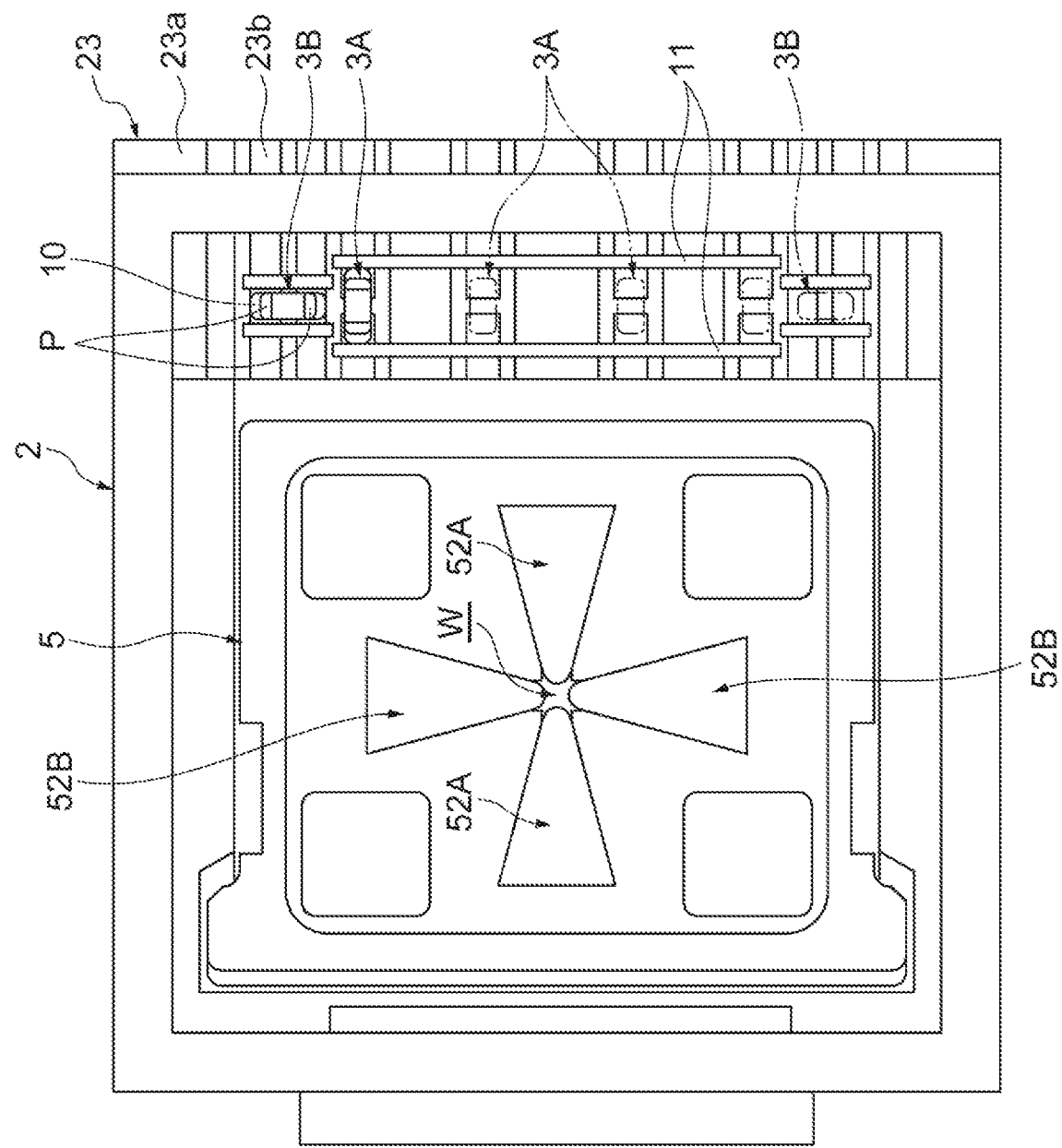
FIG. 16 is a plan view of the package and the jig shown to FIG. 14C when seen from above.

FIG. 16 is a plan view of the package 2 and the jig 5 shown in FIG. 14C when seen from above. As shown in FIG. 16, the chip capacitor 3B transferred to the mounting position (for example, on the two metalized layers 23b adjacent to each other in the Y direction) is solder-connected to the metalized layer 23b of the feedthrough 23 in the same posture as that in the state in which it is disposed in the holding space W of the jig 5. Then, similarly, Steps S4 to S7 are respectively performed using the paths 52A and 52B separately according to each of the chip capacitors 3A and 3B.

When Step S7 for the last electronic component is completed (that is, when the last electronic component among the electronic components mounted in the package 2 by the solder connection of the electrodes P is confirmed in Step S8), Step S9 is performed. In Step S9, the heating of the heater block 6 is stopped. At this time, the jig 5 and the package 2 are moved from the heater block 6, and then the jig 5 and the package 2 are cooled. Then, the mounting of the chip capacitors 3A and 3B on the package 2 is completed by curing the melted solders 10.

Next, Step S10 is performed. In Step S10, the jig 5 is removed from the package 2. For example, the operation is performed manually by gripping the jig 5 using the tweezers. The jig 5 is gripped by gripping the depressed portions 57 of the side surfaces 5e and 5f with the tweezers. In addition, Step S10 may be performed before Step S9 and may be performed in the middle of Step S9.

Next, Step S11 is performed in a state in which the jig 5 is removed from the package 2. In Step S11, the modulator 4 (refer to FIGS. 1 and 2) is disposed in the region R1 of the package 2. At this time, the jig 5 is removed from the region R2 (refer to FIGS. 4 and 5) of the package 2. Thus, it is possible to dispose the modulator 4 in the region R1. Each of the pads of the modulator 4 is connected to each of the metalized layers 23b of the feedthrough 23 by wire bonding, for example. Finally, the accommodation space V is hermetically sealed by providing a lid member (not shown) at an upper portion of the package 2, and the manufacturing of the semiconductor device 1 is completed.

As described above, in the method of manufacturing an electronic component according to the embodiment, the paths 52A and 52B allowed to communicate with the holding space W are formed in the jig 5 prepared in Step S1. The widths of the paths 52A and 52B become narrower toward the holding space W. Thus, in Step S5, the ball-shaped solders 10 supplied to positions in the passages 52A and 52B which are wider than in a position allowed to communicate with the holding space W roll along the paths 52A and 52B of which the widths are gradually narrowed and thus move toward the electrodes P of the holding space W. Accordingly, a degree of freedom of the positions for supplying the ball-shaped solder 10 can be increased, and the solders 10 can be positioned at positions reaching the electrodes P while the solders 10 roll along the paths 52A and 52B. Since the solders 10 are heated and melted at the positions at which they reach the electrodes P, in Step S7, the electrodes P can be solder-connected to the package 2 in a state in which the heated and melted solders 10 are attached within a certain range of the electrodes P. As described above, the conduction failure between the chip capacitors 3A and 3B and the package 2 can be reduced.

In the above-described method of manufacturing an electric component, Step S5 is performed in a state in which the jig 5 is maintained in a certain posture. In Step S5, the bottom surfaces 52a of the paths 52A and 52B are inclined downward with respect to the horizontal plane toward the holding space W. According to such a configuration, since the solders 10 roll obliquely downward along the paths 52A and 52B by placing the ball-shaped solders 10 on the inclined paths 52A and 52B in Step S5, the solders 10 can reach the electrodes P more reliably.

In the above-described method of manufacturing an electric component, Steps S5 and S7 are performed in the state in which the jig 5 is placed on the package 2. According to such a configuration, in Step S7, a distance for transferring the chip capacitors 3A and 3B in a state in which the solders 10 are attached to the electrodes P can be shortened. Thus, deterioration of the state of the solders 10 attached to the electrodes P during the transferring is suppressed, and the conduction failure between the chip capacitors 3A and 3B and the package 2 can be further reduced.

The above-described method of manufacturing an electric component further includes Step S11 of disposing the modulator 4 on the package 2 after Step S7, the region R2 on which the jig 5 is placed in Steps S5 and S7 includes at least a part of the region R1 of the package 2 in which the modulator 4 is disposed, and in Step S11, the modulator 4 is disposed in the region R1 in a state in which the jig 5 is removed from the region R2. Thus, the region R1 in which the modulator 4 is disposed can be effectively used.

In the above-described method of manufacturing an electric component, the recess 27 located on the side of the region R1 is formed in the package 2, the protruding portion 56 which is fitted to the recess 27 is formed on the jig 5, in Step S1, the recess 27 and the protruding portion 56 are fitted to each other, and the jig 5 is placed on the package 2. According to such a configuration, since relative movement of the jig 5 with respect to the package 2 is restricted by the fitting between the recess 27 and the protruding portion 56, shifting of the position of the jig 5 during the operation can be suppressed.

In the above-described method of manufacturing an electric component, the jig 5 has the pedestal 53 including the placement surface 53a on which the chip capacitors 3A and 3B are placed, and in Step S5, the facing surface 5g of the jig 5 which faces the electrode P may be located below the placement surface 53a. According to such a configuration, when the ball-shaped solders 10 which has reached the electrodes P are heated and melted, the solders 10 flow into the gap U and are attached to the bottom surfaces Pa of the electrodes P. Thus, in Step S7, the electrodes P can be solder-connected to the package 2 in the state in which the heated and melted solders 10 are attached within a certain range of the bottom surfaces Pa of the electrodes P. Thus, workability of mounting the chip capacitors 3A and 3B on the package 2 can be improved.

In the above-described method of manufacturing an electric component, the chip capacitors 3A and 3B have electrodes P at each of a pair of end portions facing each other. The plurality of paths 52A and 52B include the pair of paths 52A which are located with the holding space W interposed therebetween in the first direction (the X direction) and extend in the X direction. In Step S4, the chip capacitors 3A and 3B are disposed in the holding space W in a state in which the electrodes P face the respective paths 52A. In Step S5, the ball-shaped solders 10 roll along each of the paths 52A and reach each of the electrodes P. In Step S7, the chip capacitors 3A and 3B are transferred to the mounting position in the package 2 in the state in which the heated and melted solders 10 are attached to each of the electrodes P, and each of the electrodes P is solder-connected to the package 2. According to such a configuration, each of the electrodes P can be solder-connected to the package 2 in a state in which the heated and melted solders 10 are attached within a certain range of each of the electrodes P. Thus, the conduction failure between the chip capacitors 3A and 3B having the electrodes P at each of the pair of end portions and the package 2 can be reduced.

In the above-described manufacturing method, the semiconductor device 1 includes the chip capacitors 3A and 3B as electronic components. The chip capacitor 3A has the electrode P at the end portion thereof in the X direction. The chip capacitor 3B has the electrode P at the end portion in the second direction (the Y direction) which intersects the X direction. The plurality of paths 52A and 52B include the path 52A which extends in the X direction and the path 52B which extends in the Y direction. When the chip capacitor 3A is mounted in the package 2, in Step S4, the chip capacitor 3A is disposed in the holding space W in the state in which the electrode P faces the path 52A, and in Step S5, the ball-shaped solders 10 roll along the path 52A. When the chip capacitor 3B is mounted in the package 2, in Step S5, the chip capacitor 3B is disposed in the holding space W in the state in which the electrode P faces the path 52B, and in Step S5, the ball-shaped solders 10 roll along the path 52B. According to such a configuration, when the chip capacitor 3A is mounted in the package 2, and when the chip capacitor 3B is mounted in the package 2, Step S7 can be performed while the posture of the chip capacitors 3A and 3B is maintained. Thus, workability at the time of mounting the chip capacitors 3A and 3B in the package 2 in the postures different from each other can be improved.

In the above-described manufacturing method, the recess 54 is formed at a position on the jig 5 which is spaced apart from the holding space W and the paths 52A and 52B, in Step S7, the state of the solders 10 attached to the electrodes P is adjusted using the recess 54, and then the chip capacitor 3A is transferred to the mounting position of the package 2. According to such a configuration, since the state of the solders 10 is adjusted by the edge of the recess 54, the workability of mounting the chip capacitors 3A and 3B in the package 2 can be improved.

(Modified Example)

The method of manufacturing an electric component according to the present invention is not limited to the above-described embodiment, and various modifications are possible. For example, the jig prepared in Step S1 is not limited to the above-described jig 5. FIG. 17 is a cross-sectional view showing a jig according to a modified example. In a jig 5A shown in FIG. 17, the protruding portion 56 is not provided on a bottom surface 5a. The bottom surface 5a and the bottom wall 5h of the jig 5A extend over the entire length of the jig 5A in the X direction. The jig 5A has the same configuration as that of the jig 5 in other points. A size and shape of the jig 5A may be different from that of the above-described jig 5. For example, the jig 5A may be larger than the accommodation space V of the package 2 when seen from a direction (here, the Z direction) in which it faces the main surface 5b. That is, the jig 5A may not be configured to be accommodated in the package 2.

In each of the above-described steps, the jig 5A may not in a state in which it is placed on the package 2. FIGS. 18A to 18D are schematic views showing respective steps of a method of manufacturing an electronic component according to a modified example. In the modified example, an example in which the semiconductor device 1 is manufactured will be described as in the above-described embodiment. Step S1 according to the modified example is different from Step S2 according to the above-described embodiment in that the jig 5A shown in FIG. 17 is prepared, and the other points are the same as in Step S2 according to the above-described embodiment.

As shown in FIG. 18A, Step S2 according to the modified example is different from Step S2 according to the above-described embodiment in that the jig 5A and the package 2 are mounted on the heater block 6 while spaced apart from each other, and other points are the same as in Step S2 according to the above-described embodiment. Specifically, in Step S2, the jig 5A is placed directly on the heater block 6. Even in this state, the jig 5A is maintained in a certain posture as in the case of the above-described embodiment. Further, the surface 6a of the heater block 6 on which the jig 5A and the package 2 are mounted is substantially parallel to a horizontal plane (for example, an XY plane). Thus, the bottom surfaces 52a of the paths 52A and 52B of the jig 5A are inclined downward with respect to the horizontal plane toward the holding space W (refer to FIGS. 3 and 6).

The same applies to the subsequent steps. In the modified example, the process is performed up to Step S9 in a state in which the jig 5A is placed on the heater block 6 and the jig 5A is maintained in a certain posture. Specifically, as shown in FIG. 18B, Step S4 according to the modified example is different from Step S4 according to the above-described embodiment in that the chip capacitor 3A as the electronic component main body is disposed on the jig 5A placed directly on the heater block 6. On the other hand, other points are performed similarly to Step S4 according to the above-described embodiment. Subsequently, as shown in FIG. 18C, Step S5 according to the modified example is different from Step S5 according to the above-described embodiment in that the ball-shaped solders 10 are put into the jig 5A placed directly on the heater block 6. On the other hand, other points are performed similarly to Step S5 according to the above-described embodiment.

As shown in FIG. 8, Step S7 according to the modified example is different from Step S7 according to the above-described embodiment in that the chip capacitor 3A is taken out from the jig 5A placed directly on the heater block 6 and then the chip capacitor 3A is transferred to a predetermined mounting position on the package 2. Other points are performed similarly to Step S7 according to the above-described embodiment. Subsequently, Steps S8, S9, and S11 are performed as in the above-described embodiment. In the manufacturing method according to the modified example, Step S10 is omitted. Thereafter, as in the above-described embodiment, each of the pads of the modulator 4 is connected to each of the metalized layers 23b of the feedthrough 23 by wire bonding, for example. Finally, the accommodation space V is hermetically sealed by providing a lid member (not shown) on an upper portion of the package 2, and thus the manufacturing of the semiconductor device 1 is completed.

As described above, in the method of manufacturing an electronic component according to the modified example, since the chip capacitors 3A and 3B are mounted using the jig 5A, the same effects as those in the above-described embodiment can be obtained.

Figure 19A:
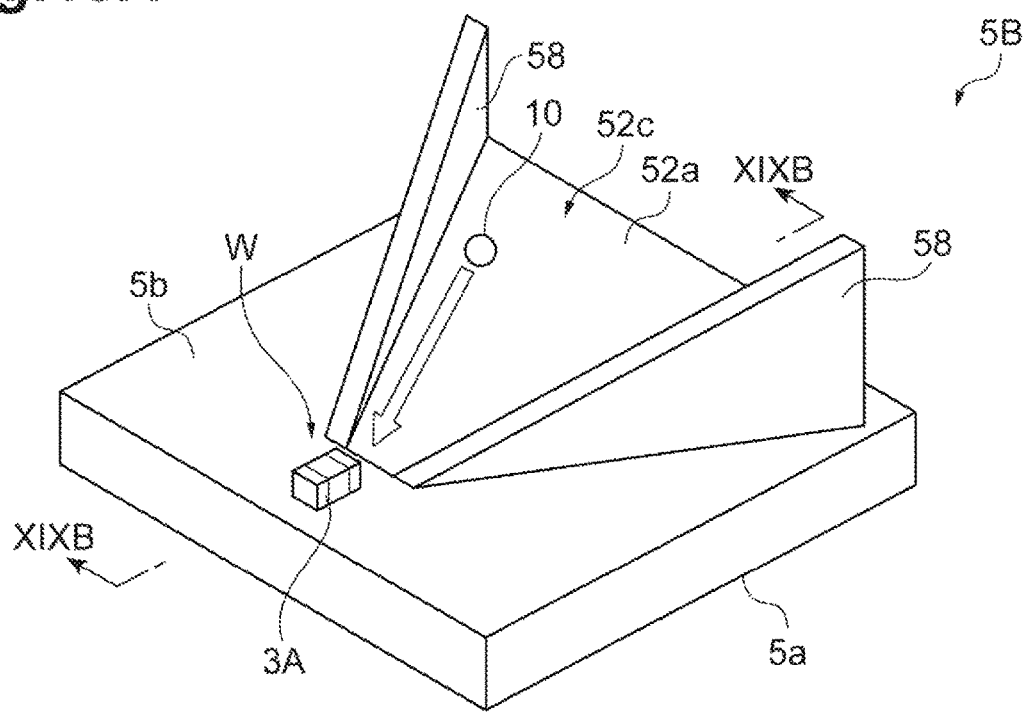
FIG. 19A is a perspective view showing a schematic configuration of a jig which has one path according to the modified example.
Figure 19B:
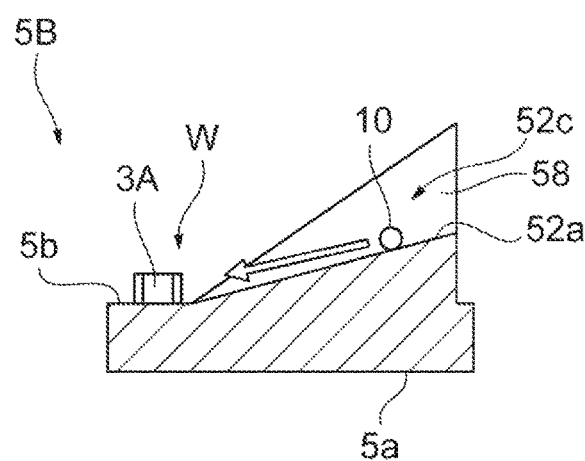
FIG. 19B is a cross-sectional view taken along line XIXB-XIXB in FIG. 19A.
Figure 19C:
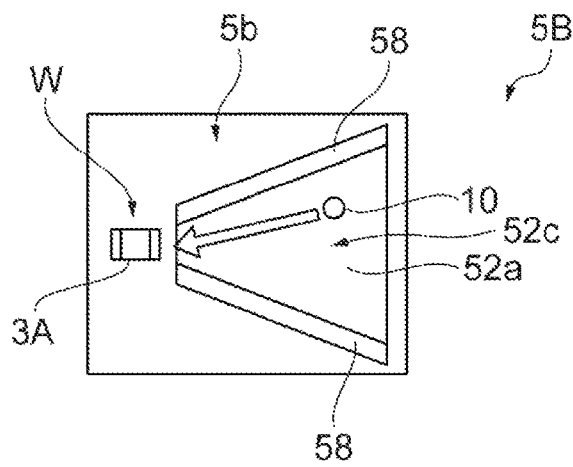
FIG. 19C is a plan view of the jig shown in FIG. 19A when seen from above.

Moreover, in the above-described embodiment and modified example, although the jigs 5 and 5A had the paths 52A and 52B formed with the grooves, the paths are not limited to a case in which they are formed by the grooves. FIGS. 19A to 19C and FIGS. 20A to 20C are diagrams for explaining the path according to the modified example. In FIGS. 19A to 19C and FIGS. 20A to 20C, illustrations other than the path are simplified for convenience. FIG. 19A is a perspective view showing a schematic configuration of the jig which has one path according to the modified example. FIG. 19B is a cross-sectional view taken along line XIXB-XIXB in FIG. 19A. FIG. 19C is a plan view of the jig shown to FIG. 19A when seen from above.

The jig 5B shown in FIGS. 19A to 19C is different from the jigs 5 and 5A in that a pair of wall members 58 provided on the main surface 5b are provided instead of the protrusion 51 provided on the main surface 5b and one path 52C (a first path, a second path) is provided instead of the plurality of paths 52A and 52B, and is configured similarly to the jig 5 or the jig 5A in other points. The pair of wall members 58 face each other in the X direction or the Y direction. The path 52C is different from the paths 52A and 52B in that it is formed by the pair of wall members 58, and is configured similarly to the path 52A or the path 52B in other points.

Figure 20A:
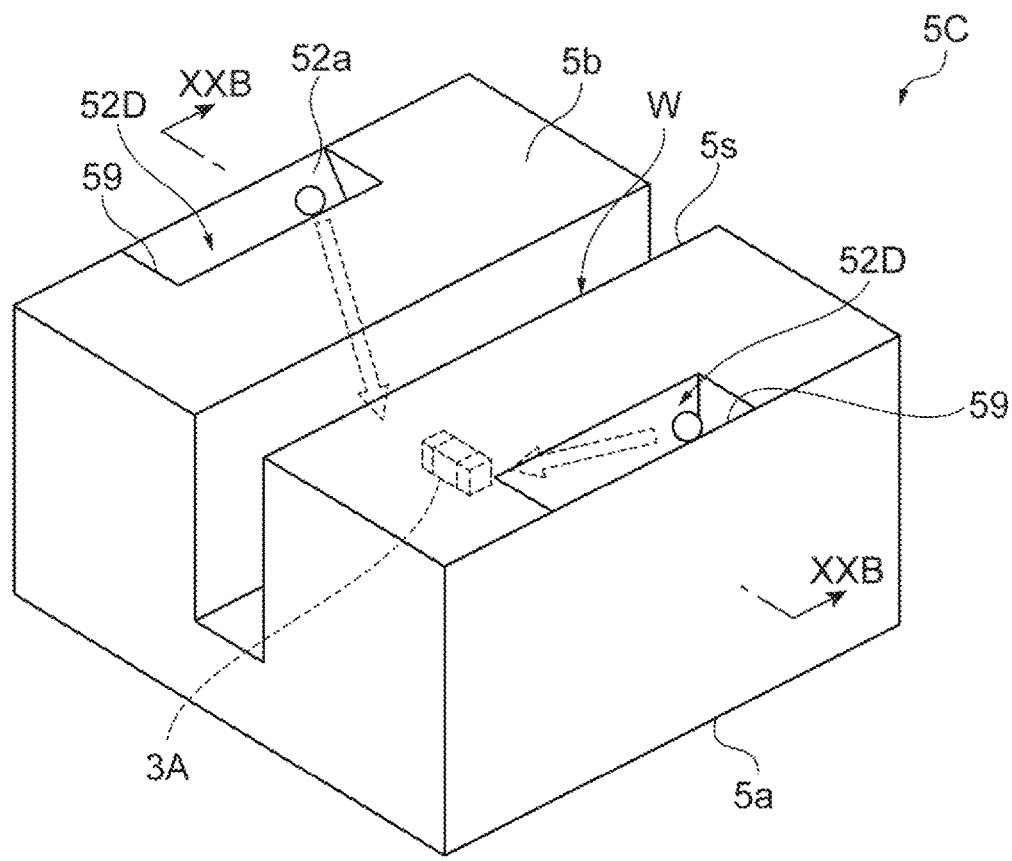
FIG. 20A is a perspective view showing a schematic configuration of a jig which has a path according to another modified example.
Figure 20B:
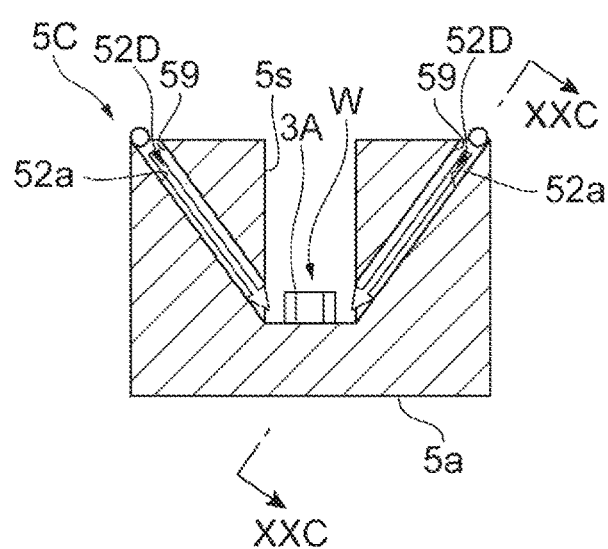
FIG. 20B is a cross-sectional view taken along line XXB-XXB in FIG. 20A.
Figure 20C:
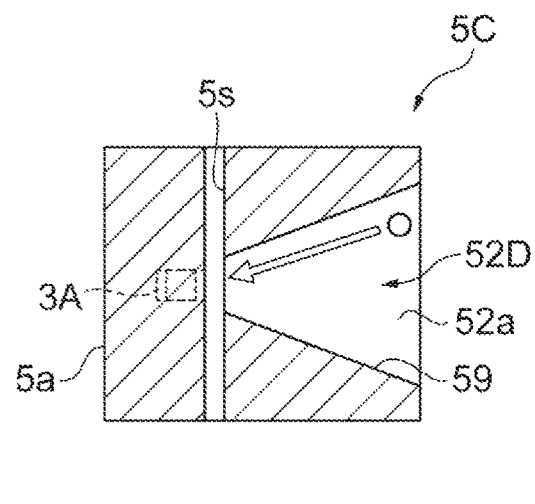
FIG. 20C is a cross-sectional view taken along line XXC-XXC in FIG. 20B.

FIG. 20A is a perspective view which shows a schematic configuration of the jig which has a path according to another modified example. FIG. 20B is a cross-sectional view along the line XXB-XXB in FIG. 20A. FIG. 20C is a cross-sectional view taken along line XXC-XXC in FIG. 20B. The jig 5C shown in FIGS. 20A to 20C is different from the jigs 5 and 5A in that a slit 5s and a pair of insertion holes 59 are provided instead of the protrusion 51 provided on the main surface 5b and two paths 52D (a first path and a second path) are provided instead of the plurality of paths 52A and 52B, and is configured similarly to the jig 5 or the jig 5A in other points.

The slit 5s extends from the main surface 5b toward the bottom surface 5a and forms a holding space W at a lower end portion thereof. The pair of insertion holes 59 are provided inside the jig 5. Each of the pair of insertion holes 59 extends from the main surface 5b toward the holding space W and penetrates to the slit 5s. The path 52D is different from the paths 52A and 52B in that it is formed by the pair of insertion holes 59, and is configured similarly to the path 52A or the path 52B in other points.

Further, the present invention is not limited to the case in which the semiconductor device 1 that is operated as a modulator is manufactured. As the semiconductor device, various semiconductor devices on which electronic components are mounted by a solder connection can be applied. For example, a laser output device, a receiver, or the like may be manufactured as the semiconductor device by the manufacturing method according to the present invention.

Further, the electronic component is not limited to the above-described chip capacitors 3A and 3B. As the electronic component, various electronic components (for example, a thermistor, an inductor, a resistor, or the like) having electrodes at end portions can be applied. Some of the plurality of paths 52A and 52B in the jigs 5 and 5A may be arbitrarily omitted according to the number of electrodes which are solder-connected to the mounted body in the applied electronic component and an orientation of the electronic component.

Further, an object on which the electronic component is mounted is not limited to the package 2. Various packages or substrates can be applied as the mounted body on which the electronic component is mounted.

What is claimed is:

1. A method of manufacturing an electronic component having an electrode at an end portion thereof, the method comprising:
    placing a jig on a heater block, wherein the jig includes a path inclined with respect to a pedestal including a placement surface and extending toward the pedestal;
    placing an electronic component main body having the electrode on the placement surface with the electrode facing the path;
    rolling a ball-shaped solder in the path to reach the electrode; and
    melting the solder through the pedestal to attach the molten solder to the electrode.

2. A method of manufacturing a semiconductor device, the method comprising:
    manufacturing the electronic component having the electronic component main body and the solder with respective steps according to claim 1; and
    transferring the electronic component from the jig to the mounted body after the melting of the solder.

3. A method of manufacturing an electronic component having an electrode at an end portion thereof, the method comprising:
    placing a jig on a mounted body, wherein the jig includes a path inclined with respect to a pedestal including a placement surface and extending toward the pedestal;
    placing the mounted body on which the jig is placed on a heater block;
    placing an electronic component main body having the electrode on the placement surface with the electrode facing the path;
    rolling a ball-shaped solder in the path to reach the electrode; and
    melting the solder through the pedestal to attach the molten solder to the electrode.

4. A method of manufacturing a semiconductor device, the method comprising:
    manufacturing the electronic component having the electronic component main body and the solder with respective steps according to claim 3; and
    transferring the electronic component from the jig to the mounted body after the melting of the solder.

5. The method of manufacturing the semiconductor device according to claim 4, further comprising:
    removing the jig from the mounted body.

6. The method of manufacturing the semiconductor device according to claim 5, further comprising:
    mounting a semiconductor element on the mounted body after the electronic component is transferred to the mounted body, wherein the semiconductor element is mounted in a region of the mounted body from which the jig is removed.

* * * * *